(12) United States Patent
Pickerd

(10) Patent No.: US 6,525,522 B1
(45) Date of Patent: Feb. 25, 2003

(54) SYSTEM FOR DETERMINING THE PHASE AND MAGNITUDE OF AN INCIDENT SIGNAL RELATIVE TO A CYCLICAL REFERENCE SIGNAL

(75) Inventor: John J. Pickerd, Hillsboro, OR (US)

(73) Assignee: Tektronix, Inc., Beaverton, OR (US)

( * ) Notice: Subject to any disclaimer, the term of this patent is extended or adjusted under 35 U.S.C. 154(b) by 5 days.

(21) Appl. No.: 09/877,795

(22) Filed: Jun. 7, 2001

(51) Int. Cl.[7] ............................................. G01R 13/34
(52) U.S. Cl. ................................. 324/76.58; 324/76.21
(58) Field of Search ......................... 324/76.11, 76.15, 324/76.21, 76.52, 76.58

(56) References Cited

U.S. PATENT DOCUMENTS

| | | | |
|---|---|---|---|
| 3,612,993 A | 10/1971 | Tims et al. | |
| 3,852,746 A | * 12/1974 | Lowenschuss et al. | 342/201 |
| 4,816,767 A | 3/1989 | Cannon et al. | |
| 4,947,130 A | 8/1990 | Kitayoshi | |
| 5,365,597 A | * 11/1994 | Holeva | 382/318 |
| 5,978,742 A | * 11/1999 | Pickerd | 702/66 |
| 6,263,028 B1 | * 7/2001 | Nagano | 375/329 |

\* cited by examiner

Primary Examiner—Christine Oda
Assistant Examiner—Walter Benson
(74) Attorney, Agent, or Firm—David N. Caracappa; Thomas F. Lenihan

(57) ABSTRACT

A system for determining the phase and magnitude of an incident signal relative to a cyclical reference signal, includes a sampler for sampling the incident signal. Autoranging circuitry is responsive to the reference signal and determines the frequency f of the reference signal and sets the sampling rate sr of the sampler. A processor, responsive to the sampler, computes a single point DFT v of the sampled incident signal responsive to the frequency of the reference signal and determines the phase θ and magnitude |v| of the incident signal relative to the reference signal in response to the single point DFT.

68 Claims, 12 Drawing Sheets

SYSTEM FOR DETERMINING THE PHASE AND MAGNITUDE OF AN INCIDENT SIGNAL RELATIVE TO A CYCLICAL REFERENCE SIGNAL

FIELD OF THE INVENTION

The present invention relates to a system for determining the phase and magnitude of an incident signal relative to a cyclical reference signal, and more specifically to such systems embodied in oscilloscope systems, and even more specifically to such systems embodied in digital storage oscilloscopes.

BACKGROUND OF THE INVENTION

It has long been required that network parameters be measured, such as magnitude and phase of the response of circuitry to a reference signal, over a range of frequencies. Other applications require similar measurements.

Many methods have been developed for making such measurements. Early solutions used slotted waveguides with inserted detectors to measure standing waves, then the circuit responses were measured manually and plotted on a Smith chart. This method required substantial manual adjustments to the mechanism, measurements of signal characteristics, and mathematical calculations to produce a Smith chart over a range of frequencies. Later developments included instruments which could display a trace on an x-y display device, such as a cathode ray tube (CRT) in an oscilloscope, which, when a Smith chart was overlaid atop the CRT, provides a real-time plot on a Smith chart. However, these instruments generally operated in conjunction with variable frequency signal generators, and included synchronous detectors. Consequently, to take measurements over a range of frequencies, the synchronous detectors, and in particular the filters associated with those detectors had to be readjusted for each change in frequency.

More recently, network analyzers have been developed which can calculate network parameters over a range of frequencies with less manual work and more accuracy than the previous methods. However, network analyzers are very expensive pieces of test equipment, and have a limited range of use, i.e. measurement of network parameters.

BRIEF SUMMARY OF THE INVENTION

In accordance with principles of the present invention, a system for determining the phase and magnitude of an incident signal relative to a cyclical reference signal, includes a sampler for sampling the incident signal. Autoranging circuitry is responsive to the reference signal and determines the frequency f of the reference signal and sets the sampling rate sr of the sampler. A processor, responsive to the sampler, computes a single point DFT v of the sampled incident signal responsive to the frequency of the reference signal and determines the phase e and magnitude |v| of the incident signal relative to the reference signal in response to the single point DFT.

A system in accordance with principles of the present invention provides the functions of the prior art systems which included a synchronous detector, but allows continuous operation of the system over a wide frequency range without requiring readjustment of any system component, such as filters.

BRIEF DESCRIPTION OF THE DRAWING

In the drawing:

FIG. 10b and FIG. 10c are waveform diagrams which may be produced on the display device in the setup illustrated in FIG. 10a;

FIG. 15a is a block diagram illustrating a test setup for measuring complex power consumption, an FIG. 15b and FIG. 15c are diagrams illustrating displays associated with the test setup illustrated in FIG. 15a.

DETAILED DESCRIPTION OF THE INVENTION

Figure 1:
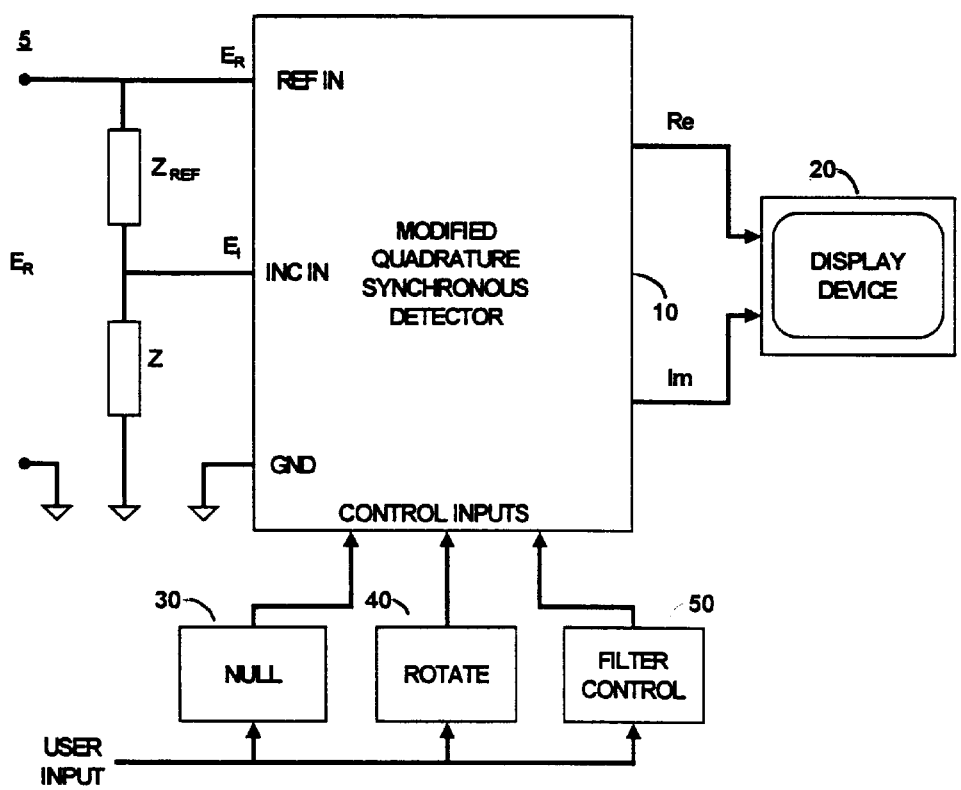
FIG. 1 is a block diagram of an impedance analyzer for a digital oscilloscope according to principles of the present invention.

FIG. 1 is a block diagram of an impedance analyzer for a digital oscilloscope according to principles of the present invention. In FIG. 1, a pair 5 of input terminals is adapted to receive a reference input signal $E_R$. A first one of the pair 5 of input terminals is coupled to a first electrode of a reference impedance $Z_{REF}$, and a reference input terminal, REF IN, of a modified quadrature synchronous detector 10. A second one of the pair 5 of input terminals is coupled to a source of reference potential (ground). A second electrode of the reference impedance $Z_{REF}$ is coupled to an incident signal input terminal, INC IN, of the modified quadrature synchronous detector 10 and a first electrode of an unknown impedance Z, whose characteristics are to be determined by the analyzer. A second electrode of the unknown impedance Z is coupled to ground. A third input terminal, GND, of the modified quadrature synchronous detector 10 is also coupled to ground. A first output terminal, Re, and a second output terminal Im of the modified quadrature synchronous detector 10 are coupled to corresponding input terminals of a display device 20. Respective output terminals of a null control 30, rotate control 40 and filter control 50 are coupled to corresponding control input terminals of the modified quadrature synchronous detector 10, and are all responsive to user input.

The impedance analyzer illustrated in FIG. 1 may be implemented in a digital sampling oscilloscope in the form of a computer program (e.g. Java), utilizing built-in functions of the oscilloscope, and providing other processing, in a manner to be described in more detail below. In operation, the reference signal $E_R$ is provided by an external sine wave generator (not shown). The signal frequencies produced by the sine wave generator covers at least the frequency range over which the impedance of the unknown impedance Z is of interest. If this frequency is a single fixed frequency, then the sine wave generator may be configured to produce a sine wave at that single frequency. Otherwise, the sine wave generator may be implemented to step or sweep through the frequencies of interest, or to be manually set by a user to respective desired frequencies of particular interest.

The modified quadrature synchronous detector 10 is coupled to receive both the reference signal $E_R$, and an incident signal $E_I$, and produces real and imaginary components, Re and Im, which are the orthogonal components representing in combination the magnitude and phase angle of the incident signal $E_I$ with respect to the reference signal $E_R$. The display device 20 processes the real and imaginary components, Re and Im, in an X-Y display mode to produce an image representing the location of the real and imaginary components, Re and Im, on the complex plane. This displayed image may have overlaid on it a known Smith chart, to aid interpretation by the user. This overlay may be a transparent covering for the screen of the display device 20, or in a preferred embodiment, may be a part of the image displayed by the display device 20.

The null control 30 is responsive to user input to null the display. More specifically, when the display is nulled the currently displayed location of the real and imaginary components, Re and Im, is translated to a predetermined location on the complex plane on the display device 20 and subsequent displays are relative to this translated null location. The rotate control 40 also is responsive to user input for rotating currently displayed location of the real and imaginary components, Re and Im, about a center point. The filter control 50 is also responsive to user input and controls the operation and characteristics of filters which can optionally process the reference signal $E_R$ and the incident signal $E_I$ at the respective input terminals of the modified quadrature synchronous detector 10, all of the above for respective purposes and in respective manners to be described below.

Figure 2A:
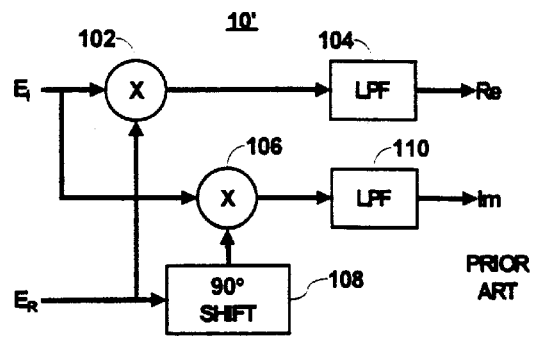
FIG. 2a is a block diagram of a prior art quadrature synchronous detector.
Figure 2B:
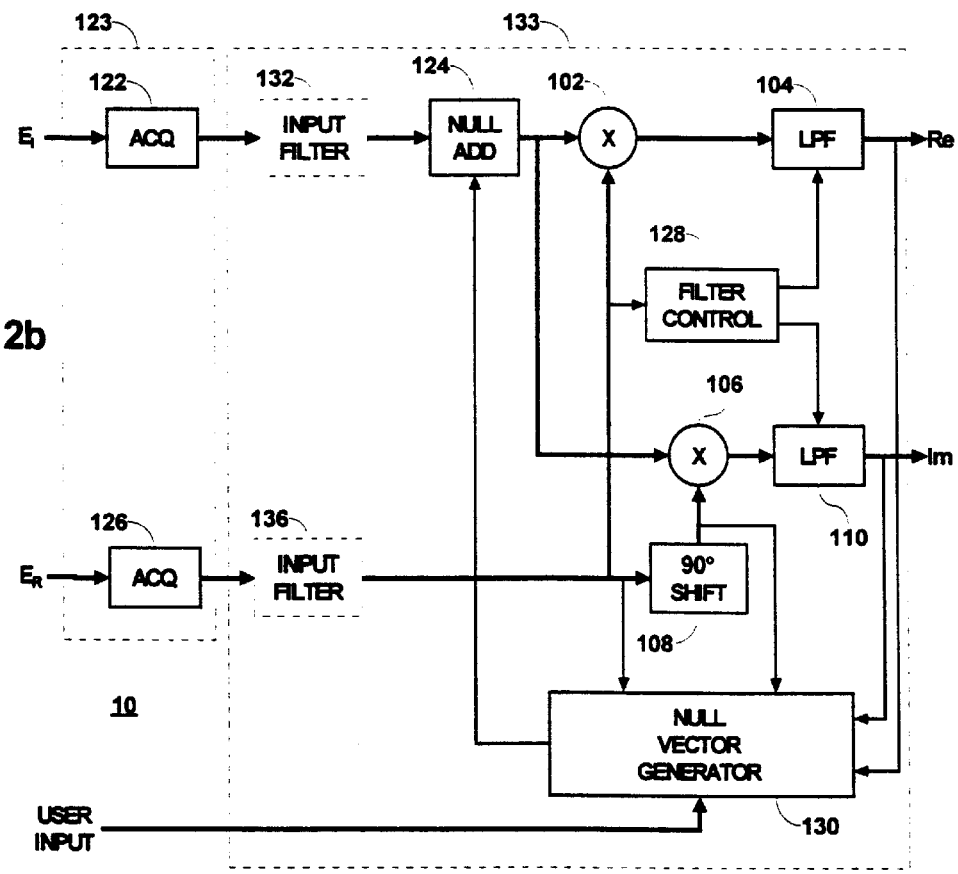
FIG. 2b is a functional block diagram of a quadrature synchronous detector modified according to principles of the present invention.

FIG. 2a is a functional block diagram of a known prior art quadrature synchronous detector 10' which will be useful in understanding the more detailed functional block diagram of the modified quadrature synchronous detector 10 (of FIG. 1) illustrated in FIG. 2b. In FIG. 2a, the incident signal $E_I$ input terminal (INC IN) is coupled to respective first input terminals of a first mixer 102 and a second mixer 106. The reference signal $E_R$ input terminal (REF IN) is coupled to a second input terminal of the first mixer 102 and to an input terminal of a 90 degree shift device 108. An output terminal of the 90 degree shift device 108 is coupled to a second input terminal of the second mixer 106. An output terminal of the first mixer 102 is coupled to an input terminal of a first low pass filter (LPF) 104. An output terminal of the first LPF 104 is coupled to an output terminal Re. An output terminal of the second mixer 106 is coupled to an input terminal of a second low pass filter (LPF) 110. An output terminal of the second LPF 110 is coupled to an output terminal Im.

The circuit illustrated in FIG. 2a operates in a known manner as a quadrature synchronous detector. The quadrature synchronous detector 10' generates real and imaginary components, Re and Im, representing the phase and the magnitude of the incident input signal $E_I$ with respect to the reference signal $E_R$, all in a known manner.

FIG. 2b is a functional block diagram of a modified quadrature synchronous detector 10 according to principles of the present invention. In FIG. 2b, those elements which are the same as those illustrated in FIG. 2a are designated by the same reference number and are not described in detail below. In addition, in FIG. 2b, conductors carrying data signals are represented by thicker lines and conductors carrying control signals are represented by thinner lines. As described above, the modified quadrature synchronous detector 10 is implemented in a digital sampling oscilloscope.

In FIG. 2b, the incident signal $E_I$ input terminal is coupled to an input terminal of a first sample acquisition circuit 122. An output terminal of the first sample acquisition circuit 122 is coupled to a signal input terminal of a null vector adding circuit 124. An output terminal of the null vector adding circuit 124 is coupled to respective the first input terminals of the first and second mixers, 102 and 106.

The reference signal $E_R$ input terminal is coupled to an input terminal of a second sample acquisition circuit 126. An output terminal of the second sample acquisition circuit 126 is coupled to the input terminal of the 90 degree phase shift circuit 108 and the second input terminal of the first mixer 102, and also to a first clock signal input terminal of a null vector generator circuit 130, and a control input terminal of a filter control circuit 128. Respective control output terminals of the filter control circuit 128 are coupled to corresponding control input terminals of the first and second LPFs 104 and 110. The output terminal of the 90 degree phase shift circuit 108 is coupled to the input terminal of the second mixer 106 and also to a second clock signal input terminal of the null vector generator circuit 130. The real and imaginary component output terminals, Re and Im, are also coupled to respective signal input terminals of the null vector generator 130. A user input terminal is coupled to a corresponding input terminal of the null vector generator 130. An output terminal of the null vector generator 130 is coupled to a control input terminal of the null vector adding circuit 124.

The operation of the modified quadrature synchronous detector 10 illustrated in FIG. 2b corresponds generally to that of the quadrature synchronous detector 10' illustrated in the FIG. 2a. The first and second sample acquisition circuits, 122 and 126, form a part of the sampling subsystem 123 in the digital sampling oscilloscope in which the modified quadrature synchronous detector 10 is implemented, and generate respective sequences of samples representing the incident signal $E_I$ and the reference signal $E_R$. Samples from the first and second sample acquisition circuits, 122 and 126, are provided to the first and second mixers, 102 and 106, which are implemented in digital form, and operate in the same manner as in FIG. 2a.

The 90 degree phase shift circuit 108 may be implemented as a digital FIR filter, configured to operate as a Hilbert filter. Such a filter may be configured to provide a 90 degree phase shift over a wide range of frequencies. Alternatively, the 90 degree phase shift circuit 108 may be implemented as a delay line from which samples, delayed by a time interval representing a 90 degree phase shift at the frequency of the reference signal $E_R$, are selected from the sample sequence produced by the second sample acquisition circuit 126, obviating the necessity for a Hilbert filter. The accuracy of the 90 degree phase shift produced using this method depends upon the rate of the sampling performed by the second sample acquisition circuit 126 and/or upon appropriate interpolation between samples to accurately provide the 90 degree phase shift.

As is well known, the LPFs 104 and 110 operate to filter out the out-of-band (i.e. second harmonic) modulation products in the output samples from the first and second mixers 102 and 106 respectively. In the illustrated embodiment, they are implemented as adaptive digital filters. The filter control circuit 128 is responsive to the frequency of the reference signal $E_R$ to control the frequency response characteristics of the first and second LPFs 104 and 110. More specifically, the frequency of the reference signal $E_R$ can vary widely according to the characteristics of the network being analyzed. The filter control circuit 128 determines the frequency of the reference signal $E_R$ and conditions the cut-off frequencies of the LPF 104 and 110 to the appropriate frequency relative to the current frequency of the reference signal $E_R$.

Under some circumstances, and for some applications, it is further required or desirable to filter the reference signal $E_R$ and the incident signal $E_I$ before being mixed in the respective mixers 102 and 106. For one example, transducers producing the incident signal $E_I$ and/or the reference signal $E_R$ can generate spurious noise which produces interference in the desired signal. Such noise can be filtered out by appropriate filtering. To provide such filtering, respective input filters 132 and 136 may be coupled between the first and second sample acquisition circuits 122 and 126 and the first and second mixers 102 and 106. These input filters 132 and 136 are illustrated in phantom in FIG. 2b. These filters are also implemented as adaptive filters, receiving a control signal (not shown in order to simplify the figure) in a known manner.

As with the quadrature synchronous detector 10' (of FIG. 2a), the analyzer of FIG. 2b generates real and imaginary components, Re and Im, from the LPFs 104 and 110, representing the phase and the magnitude of the incident input signal $E_I$ with respect to the reference signal $E_R$, all in a known manner.

The null vector adding circuit 124 operates to add a null 1vector to the incident signal $E_I$ before mixing. The null vector is generated by the null vector generator circuit 130 in response to the in-phase and quadrature reference signal $E_R$ from the second sample acquisition circuit 126 and the 90 degree phase shift circuit 108, respectively. The magnitude and phase of the null vector is set by null scalars derived from real and imaginary values, Re and Im, taken from the output of LPFs 104 and 110, in response to a user input. Adding such a null vector to the incident signal $E_I$ operates to translate the location of the real and imaginary components, Re and Im, displayed on the display device (of FIG. 1) to a location relative to the nulled location.

For example, in some circumstances, the impedance characteristics of an unknown impedance is desired not on an absolute basis, but relative to a known impedance value. For example, the impedance of a speaker being tested may be desired relative to a standard speaker impedance (e.g. 8 ohms); or the input impedance of a coaxial cable receiver circuit being tested may be desired relative to a standard coaxial cable characteristic impedance (e.g. 50 ohms). The combination of the null vector generator 130 and null vector adding circuit 124 provides this function.

Referring again to FIG. 1, in operation, the unknown impedance Z is replaced by an impedance having the known standard impedance $Z_0$ (for example, 8 ohms for a speaker, or 50 ohms for a cable receiver circuit). The external sine wave generator, generating the reference signal $E_R$, is set to the desired frequency and the analyzer is operated to produce real and imaginary signals, Re and Im, representing the phase and magnitude of the incident signal $E_I$ relative to the reference signal $E_R$. The results of this analysis are displayed on the display device 20 in a manner to be described in more detail below.

When the analysis is complete and stable, the user activates the null control circuit 30 (of FIG. 1), which may be a button or switch on the face of the digital sampling oscilloscope. In response, the null vector generator 130 (of FIG. 2b) reads the values of the real and imaginary components, Re and Im, and calculates the magnitude and phase of a null vector which, if added to the incident signal $E_I$ will cause the real and imaginary components, Re and Im, to produce an image on the display device at a predetermined desired location. The null vector generator 130 then begins to produce such a null vector in response to the reference signal $E_R$ from the second sample acquisition circuit 126 and its quadrature signal from the 90 degree phase shift device 108. This null vector is then added to the incident signal $E_I$ in the null vector adding circuit 124. The resulting image on the display device 20, then, is located at the desired predetermined location. For example, the desired predetermined location representing the reference impedance $Z_0$ may be the center of the display device, which in a Smith chart, represents a complex value 1+j0. The reference impedance $Z_0$ is then removed from the circuit (of FIG. 1) and the unknown impedance Z is inserted in its place. The combination of the null vector generator 130 and the null vector adding circuit 124 operate to produce an image on the display device 20 representing the impedance of the unknown impedance Z relative to the known impedance $Z_0$.

Figure 3:
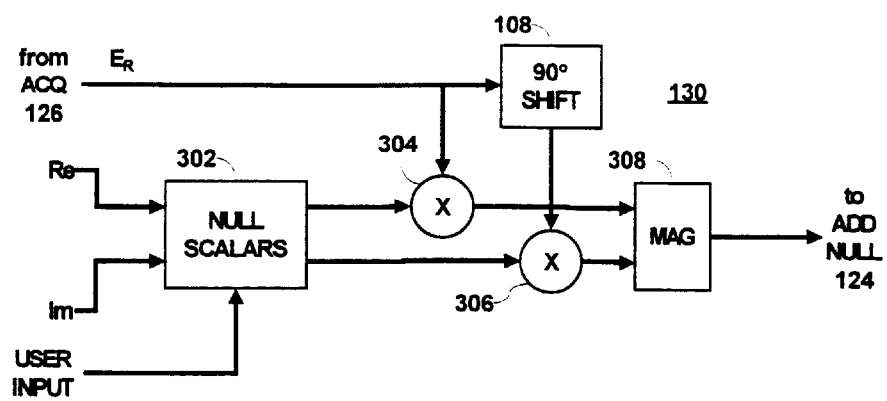
FIG. 3 is a more detailed block diagram of a null vector generator 130, used in the modified quadrature synchronous detector 10 illustrated in FIG. 2b.

FIG. 3 is a more detailed block diagram of a null vector generator 130, used in the modified quadrature synchronous detector 10 illustrated in FIG. 2b. In FIG. 3, the reference signal $E_R$ from the second sample acquisition circuit 126 (of FIG. 2b) is coupled to a first input terminal of a first mixer 304 and the input terminal of the 90 degree shift device 108 (as illustrated in FIG. 2b). The output terminal of the 90 degree phase shift device 108 is coupled to a first input terminal of a second mixer 306. The real and imaginary input terminals, Re and Im, from LPFs 104 and 110 (of FIG. 2b), are coupled to corresponding input terminals of a null scalar circuit 302. A user input terminal is coupled to a corresponding input terminal of the null scalar circuit 302.

A real scalar output terminal of the null scalar circuit 302 is coupled to a second input terminal of the first mixer 304. An imaginary scalar output terminal of the null scalar circuit 302 is coupled to a second input terminal of the second mixer 306. Respective output terminals of the first mixer and the second mixer 306 are coupled to corresponding input terminals of a magnitude calculating circuit 308. An output terminal of the magnitude calculating circuit 308 is coupled to the control input terminal of the null vector adding circuit 124 (of FIG. 1).

In operation, when the output values from the LPFs 104 and 110 are stable, as described above, the user supplies a user input signal to the null scalar circuit 302. This conditions the null scalar circuit 302 to latch the current values of real and imaginary components, Re and Im, from the LPFs 104 and 110. The null scalar circuit 302 then calculates in-phase and quadrature components of a vector, which, if added to the incident input signal INC IN, would result in an image on the display device 20 (of FIG. 1) at a predetermined location. These vector components are then modulated into two in-phase and quadrature components of a phasor by the in-phase and quadrature components of the reference signal $E_R$ from the second sample acquisition circuit 126 and the 90 degree phase shift circuit 108, respectively. The magnitude calculating circuit 308 generates the phasor from the in-phase and quadrature components. The vector from the magnitude calculating circuitry is then added to the incident input signal INC IN by the null vector adding circuit 124.

The operation of adding a null vector from the magnitude calculator 308 to the incident input signal $E_I$, both moves the image displayed on the display device 20 (of FIG. 1), and compensates for the impedance and cable length characteristics of the test setup.

Figure 4:
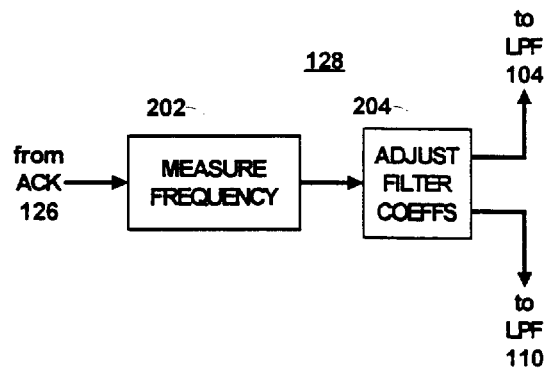
FIG. 4 is a more detailed block diagram of filter control circuitry, used in the modified quadrature synchronous detector 10 illustrated in FIG. 2b.

FIG. 4 is a more detailed block diagram of filter control circuitry, used in the modified quadrature synchronous detector 10 illustrated in FIG. 2b. In FIG. 4, the reference signal $E_R$ from the second sample acquisition circuit 126 is coupled to an input terminal of a frequency measuring circuit 202. In the illustrated embodiment, implemented in a digital sampling oscilloscope, the frequency measurement circuit 202 is part of the digital sampling oscilloscope. An output terminal of the frequency measuring circuit 202 is coupled to an input terminal of a coefficient adjusting circuit 204. Respective output terminals of the coefficient adjusting circuit 204 are coupled to corresponding control input terminals of the LPFs 104 and 110.

In operation, the LPFs 104 and 110 (of FIG. 2b) are conditioned to attenuate the out-of-band modulation products (i.e. second harmonic signals) inherent in the synchronous detection process. Because the frequency of the reference signal $E_R$ may vary over a relatively wide range, the LPFs 104 and 110 must be controlled to exhibit characteristics appropriate to the frequency. The frequency measurement circuit 202 operates to detect the frequency of the reference signal $E_R$, in a known manner. Appropriate filter coefficients for the LPFs 104 and 110 are calculated in the coefficient adjusting circuit 204 in response to the detected frequency. These coefficients are supplied to the LPFs 104 and 110. The LPFs 104 and 110 are then conditioned to operate to filter out the out-of-band modulation products, in a known manner.

Figure 5:
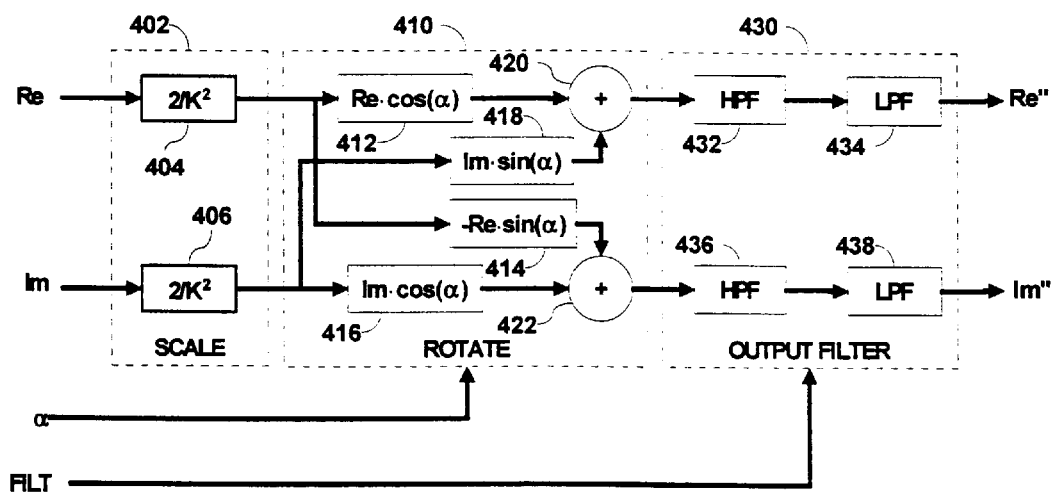
FIG. 5 is a block diagram of circuitry for providing such post processing of the real and imaginary components, Re and Im.

Referring again to FIG. 2b, some post processing of the real and imaginary components, Re and Im, may be required and/or desirable. FIG. 5 is a block diagram of circuitry for providing exemplary post processing. FIG. 5 shows a serial connection of a scaling circuit 402, a rotating circuit 410 and an output filter circuit 430, coupled to the respective output terminals of the LPFs 104 and 110. Respective output terminals of the output filter circuit 430 produce processed real and imaginary components, Re" and Im". These components are supplied to the display device 20 (of FIG. 1).

One skilled in the art will understand that other processing functions may be added to or substituted for the functions illustrated in FIG. 5. One skilled in the art will further understand that different ones of the illustrated post processing blocks will be necessary in different applications. The post processing blocks which are not necessary for a particular application will be removed from the processing circuitry, or conditioned to pass signals at their input terminals directly to their output terminals unchanged. One skilled in the art will further understand that, although the post processing circuits are illustrated in a particular order in FIG. 5, the order is not germane to the present invention, and that it is possible to rearrange the order, and that such a rearrangement may be desirable under some circumstances.

In some applications, it is necessary to scale the output signals from the LPFs 104 and 110. For example, when the modified quadrature synchronous detector 10 is used to analyze an unknown impedance, the real and imaginary component output signals, Re and Im, must scaled relative to the value of the peak amplitude K of the reference input signal $E_R$. In FIG. 5, respective Re and Im input terminals, are coupled to corresponding output terminals of the LPFs 104 and 110 (not shown, of FIG. 2) and receive the real and imaginary component signals, Re and Im. The Re and Im input terminals are coupled to respective input terminals of a first and a second scaling circuit 404 and 406. Respective output terminals of the first and second scaling circuits, 404 and 406, are coupled to corresponding input terminals of the rotating circuit 410.

In operation, scaling circuit 402 scales the real and imaginary components, Re and Im, from the LPFs 104 and 110 (of FIG. 2b). In the illustrated embodiment, the scaling factor appropriate for using the modified quadrature synchronous detector 10 to analyze an unknown impedance is $2/K^2$, where K is the peak value of the reference input signal $E_R$. In other applications, for example if the modified quadrature synchronous detector 10 is used for dynamic complex power analysis (described in more detail below), the scaling factor will be different. One skilled in the art will know how to derive the appropriate scaling factor, depending on the application for which the modified quadrature synchronous detector 10 is being used.

It is also useful to be able to rotate the image displayed on the display device 20 (of FIG. 1). For example, it may be desirable to rotate a lobe of interest in the displayed image to be aligned with a vertical or horizontal axis so it may be measured more precisely against the graticule. In FIG. 5, the desired angle of rotation of the image displayed on the display device 20 is designated α.

A user input signal representing the desired rotation angle α is coupled to an input terminal of the rotating circuit 410. The scaled real component Re is coupled to respective input terminals of a first calculating circuit 412 which produces an output value Re·cos (α) and a second calculating circuit 414 which produces an output value—Re·sin (α). The scaled imaginary component Im is coupled to respective input terminals of a third calculating circuit 416 which produces an output value Im·cos (α); and a fourth calculating circuit 418 which produces an output value Im·sin (α). An output terminal of the first calculating circuit 412 is coupled to a first input terminal of a first adder 420 and an output terminal of the fourth calculating circuit 418 is coupled to a second input terminal of the first adder 420. An output terminal of the second calculating circuit 414 is coupled to a first input terminal of a second adder 422 and an output terminal of the third calculating circuit 416 is coupled to a second input terminal of the second adder 422. Respective output terminals of the first and second adders 420 and 422 generate signals representing rotated (and scaled) real and imaginary components.

In operation, the user conditions the rotate control circuit 40 (of FIG. 1) to generate a signal representing the desired rotation angle a for the rotating circuit 410. This signal is coupled (not shown in order to simplify the figure) to the first, second, third and fourth calculating circuits, 412, 414, 416, and 418. The remainder of the rotating circuit 410 operates in a known manner to rotate the input real and imaginary components, Re and Im, by an angle α.

As described above with reference to the reference input signal REF IN, and the incident input signal INC IN, it is sometimes desirable to filter the processed (scaled and rotated) real and imaginary components to attenuate undesired noise components, e.g. from transducers or other sources, which may interfere with accurately measuring the unknown impedance.

In FIG. 5, a filter control signal FILT, from the filter control circuit 50 (of FIG. 1), is coupled to a control input terminal of the output filter circuit 430. The output filter circuit 430 comprises a series connection of a first adaptive high pass filter (HPF) 432 and a first adaptive LPF 434 coupled to receive the rotated and scaled real component, and a series connection of a second adaptive HPF 436 and a second adaptive LPF 438 coupled to receive the rotated and scaled imaginary component. The filter control signal FILT is coupled (not shown to simplify the figure) to respective control input terminals of the first and second HPFs, 432 and 436, and the first and second LPFs, 434 and 438, in a known manner. Respective output terminals of the first and second LPFs, 434 and 438, produce processed real and imaginary components, Re" and Im", which are coupled to the display device 20.

In operation, the user operates the filter control circuit 50 (of FIG. 1) to specify the desired output filter characteristics. The characteristics of the first and second HPFs, 432 and 436, and the first and second LPFs, 434 and 438, are set in response to this signal. Although the output filter circuit 430 is illustrated as serially connected HPFs and LPFs, one skilled in the art will understand that different filter arrangements may be used. One skilled in the art will further understand that such filters may be fixed and not adaptive if the modified quadrature synchronous detector 10 is used for a single application.

The functional block diagrams of FIG. 1 to FIG. 5 are all illustrated in the form of hardware devices, and an impedance analyzer according to the present invention may be implemented in hardware as illustrated. However, one skilled in the art will understand that each functional block illustrated in those figures may be implemented by a processor 133 (of FIG. 2b), such as a microprocessor executing a control program, or a digital signal processor (DSP). Furthermore, the functions illustrated in those figures may be implemented within a digital storage oscilloscope. More specifically, digital storage oscilloscopes which provide the capability for processing of received samples by a processor in response to a control program, such as one of the Tektronix TDS 7000 series of oscilloscopes, are a preferred embodiment.

Figure 6:
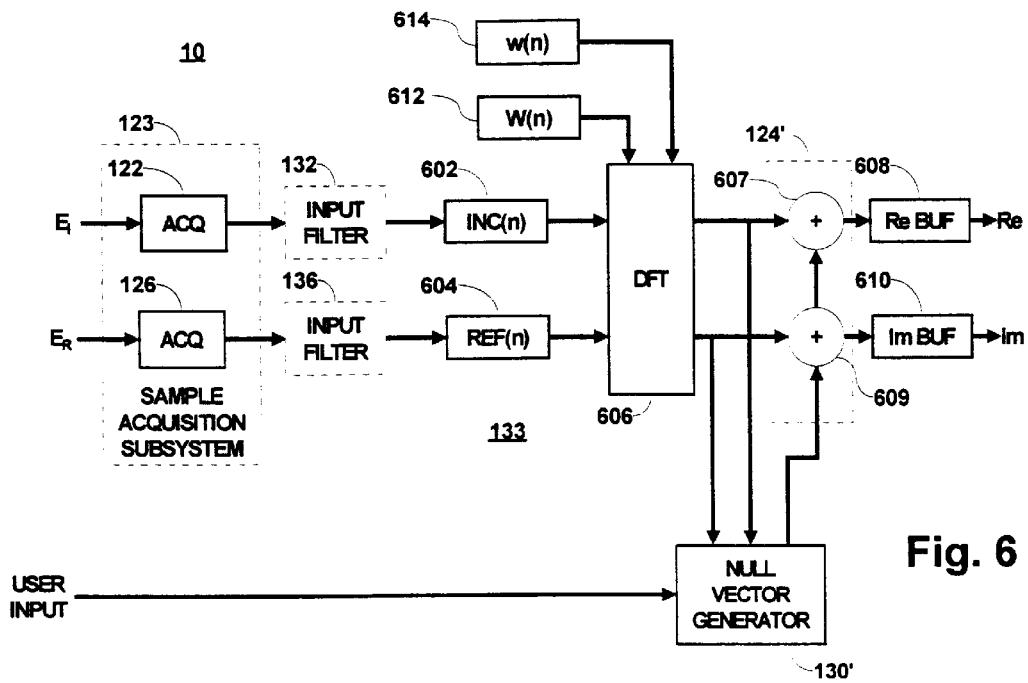
FIG. 6 is a block diagram of an impedance analyzer embodied in a digital sampling oscilloscope.

FIG. 6 is a more detailed block diagram of the impedance analyzer illustrated in FIG. 2b, implemented within a digital sampling oscilloscope including programming capability (as described above), and FIG. 7 is a flow chart useful for understanding the operation of the digital sampling oscilloscope embodiment illustrated in FIG. 6. In FIG. 6, those elements which are the same as, or similar to, those illustrated in FIG. 2b are designated by the same reference numbers and are not described in detail below.

In FIG. 6, the incident signal $E_I$ is received from a first channel input terminal of the digital sampling oscilloscope and the reference signal $E_R$ is received from a second channel input terminal of the digital sampling oscilloscope, in a known manner. The first and second sample acquisition circuits, 122 and 126, are comprised in the oscilloscope sample acquisition subsystem 123 which is coupled to the first and second channel input terminals, respectively. The remainder of FIG. 6 is illustrated as a functional block diagram implemented as a program executed within a processor 133 in a manner to be described in more detail below. The output terminal of the first input filter 132 is coupled to an input terminal of a first buffer 602 for holding samples representing the incident signal $E_I$. The output terminal of the second input filter 136 is coupled to an input terminal of second buffer 604 for holding samples representing the reference signal $E_R$.

Respective output terminals of the first and second buffers, 602 and 604 are coupled to corresponding input terminals of a discrete Fourier transform (DFT) calculating circuit 606. Respective output terminals of a third buffer 612 and a fourth buffer 614 are coupled to a corresponding input terminals of the DFT calculating circuit 606. A real component output terminal of the DFT circuit 606 is coupled to an input terminal of a first adder 607 and an imaginary component output terminal of the DFT circuit 606 is coupled to an input terminal of a second adder 609. The combination of the first and second adders 607 and 609 form a null vector adding circuit 124'. An output terminal of the first adder 607 is coupled to an input terminal of a real component buffer circuit (Re BUF) 608, and an output terminal of the second adder 609 is coupled to an input terminal of an imaginary component buffer circuit (Im BUF) 610. Respective output terminals of the real and imaginary component buffer circuits, 608 and 610, produce real and imaginary component signals, Re and Im, which are post processed, as described above in relation to FIG. 5, and ultimately displayed on the display device 20 (not shown, of FIG. 1).

In operation, the sample acquisition subsystem 123 receives input signals from first and second channel oscilloscope probes and generates samples representing those input signals. The digital sampling oscilloscope sample acquisition subsystem 123 can provide automatic ranging, which automatically sets the sampling rate so that a sufficient number of samples are taken of the input signal to accurately represent that signal. The automatic ranging function can also provide appropriate scaling of the input signals so that sufficient resolution is provided from the analog-to-digital (A/D) converters (not shown), all in a known manner.

The DFT circuit 606 operates on the buffered reference $E_R$ and incident $E_I$ samples, from buffer circuits 602 and 604, respectively, to perform a series of single point Fourier transforms of the incident signal $E_I$ at the frequency of the reference signal $E_R$, in a manner to be described in more detail below. The result is a series of complex numbers representing the real and imaginary components of a vector representing the magnitude and phase of the incident signal $E_I$ with respect to the reference signal $E_R$.

When the user activates the null control circuit 30 (of FIG. 1), the null vector generator 130' conditions the null vector adding circuit 124' to generate a signal which will result in the display of an image at a predetermined location on the display device 20, as described above. The null vector adding circuit 124' generates a series of complex numbers representing the real and imaginary components of the nulled vector.

This series of complex numbers is buffered in respective ring buffers 608 and 610. The respective ring buffers 608 and 610 provide the real and imaginary components, Re and Im, for a series of complex numbers to be post processed as described above with reference to FIG. 5. The post processed complex numbers are then analyzed to determine the unknown impedance Z, and the discrete reactive X (inductive L or capacitive C) component and the resistive A component of the unknown impedance Z in a manner to be described in more detail below. The results of this analysis is then displayed on the display device 20 (of FIG. 1) in graphical form in a Smith chart and/or in numerical form, in a manner to be described in more detail below.

Figure 7:
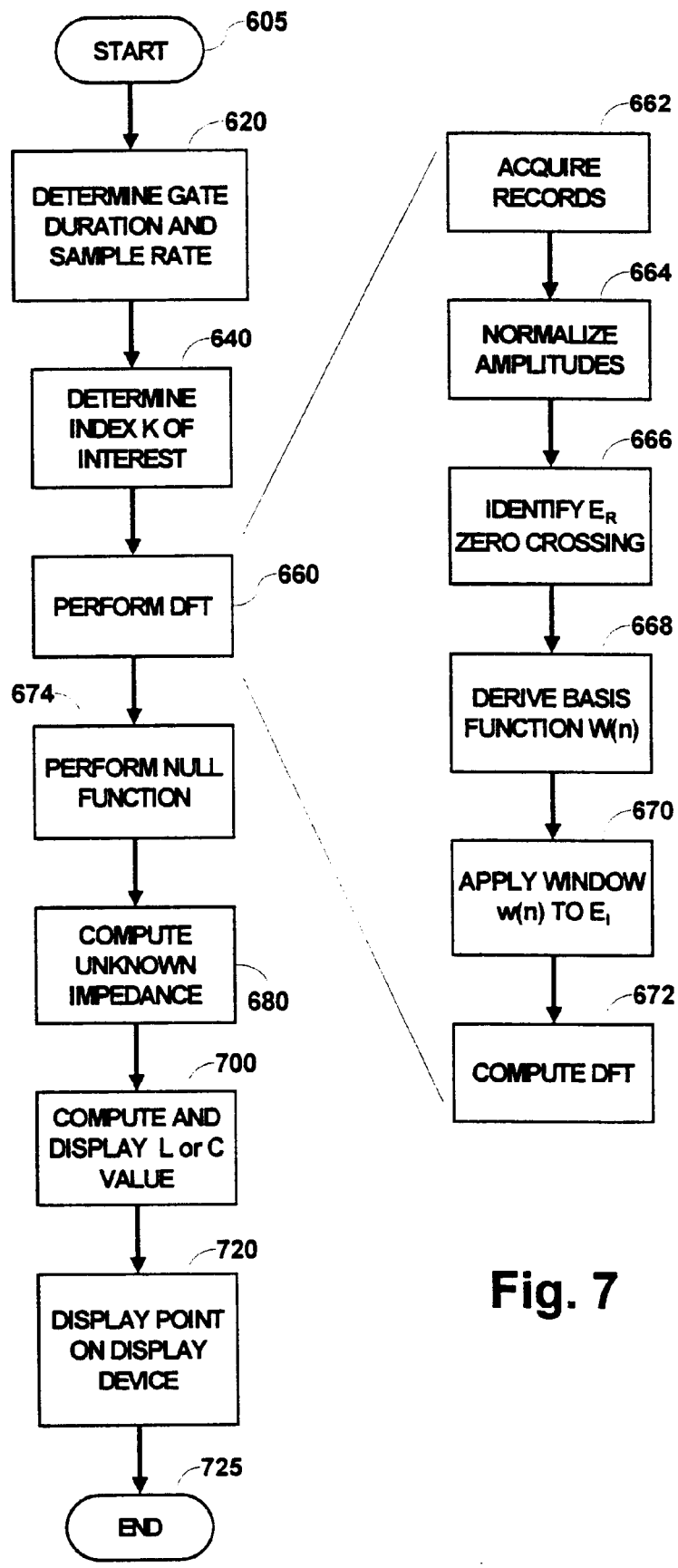
FIG. 7 is a flowchart useful for understanding the operation of the digital sampling oscilloscope embodiment illustrated in FIG. 6.

Referring to FIG. 7, the process of determining the value of the unknown impedance Z begins in step 605. In step 620, the auto-ranging function of the digital sampling oscilloscope is used to automatically set the sampling frequency and gate duration of the sample acquisition system of the digital sampling oscilloscope. This permits the user to manually change the frequency of the reference signal $E_R$ (for purposes described below), while the auto-ranging function automatically adjusts the sampling parameters of the digital sampling oscilloscope appropriately.

The auto-ranging function initially sets the gate width N to 5000 samples, i.e. N=5000. In order to provide sufficient accuracy in the DFT, the auto-ranging function conditions the sample acquisition system to acquire M cycles of the reference signal $E_R$ in the N=5000 samples. In the illustrated embodiment, the number of cycles M is at least 50. More specifically, for reasons to be described below, at least 52 cycles of the input signals are acquired in the 5000 samples, i.e. M=52. It is preferred to provide around 100 samples per cycle. One skilled in the art will understand that the gate width N and/or the number of cycles M may be adjusted in an appropriate manner to attain the desired number of samples per cycle.

The frequency f of the reference signal $E_R$ is then determined by known internal circuitry (not shown) in the digital sampling oscilloscope. The sample rate sr required is then calculated as $$sr = \frac{f \cdot N}{M}.$$

In many digital sampling oscilloscopes, there are a predetermined number of preset sampling rates. The sample rate selected in such a digital sampling oscilloscope would be the next preset sampling rate greater than the sampling rate sr calculated by the above equation.

One skilled in the art will understand that a full DFT transforms a set of N input samples into a set of N complex numbers representing the magnitude and phase of respective components of the input signal at N corresponding frequencies. In the present invention, only a single one of the frequencies (the frequency of the reference signal $E_R$) is of interest. This frequency is represented by an index K. The index K of interest is calculated as $$K = \frac{\pi \cdot sr}{N \cdot f}$$

in step 640. Because the index K is determined in advance, only the single point K of a DFT need be calculated.

The single point DFT is then performed in step 660. More specifically, in step 662 respective records of N samples each of the incident signal $E_I$ and the reference signal $E_R$, sampled at the sampling rate sr, are acquired by the digital sampling oscilloscope sample acquisition subsystem 123. These records are stored in the buffers 602 and 604, respectively.

In step 664, the amplitudes of the incident signal $E_I$ and the reference signal $E_R$ are normalized to the peak value of the reference signal $E_R$. That is, the peak magnitude of the reference signal $E_R$ is scaled to 1. In the preferred embodiment, the scale factor is calculated by using the rms function built into the digital sampling oscilloscope. The rms voltage $V_{rms}$ of the reference signal $E_R$ is received from the known rms function circuitry (not shown) in the digital sampling oscilloscope. Then the peak value $V_P$ of the reference signal $E_R$ is calculated as $$V_P = \sqrt{2} \cdot V_{RMS}.$$

The reference signal samples, $E_R(n)$, and the incident signal samples, $E_I(n)$, are then each scaled by a scale factor $S=1/V_P$. One skilled in the art will understand, however, that this scaling may be performed in the post processing, as described above with reference to FIG. 5. In a preferred embodiment, the scaling is performed in the post processing.

In step 666, the time location of the first positive going zero crossing in the reference signal $E_R$ is identified from the samples in the record in the second buffer 604. The time location of this zero crossing is selected to be the time location of the beginning of the M (i.e. 50) cycles of the incident signal $E_I$ from which the DFT will be computed. Because the sample timing of the sample acquisition subsystem 123 is asynchronous with both the incident signal $E_I$ and the reference signal $E_R$, it is not to be expected that samples of the incident signal $E_I$ and the reference signal $E_R$ are going to be taken at exactly the time of the zero crossing of the reference signal $E_R$. Thus, there will be a sample before and below the zero crossing and a next following sample which will be after and above the zero crossing. In a preferred embodiment, a time interpolation is performed between the sample just before and below the zero crossing, and the sample just after and above the zero crossing to estimate the time at which the zero crossing actually occurred. An intersample time displacement $t_{disp}$ is determined, which is the time interval between the estimated time of the zero crossing of the reference signal $E_R$, as determined from the interpolation described above, and the first sample time after the zero crossing. As described above, if samples representing 52 cycles of the incident signal $E_I$ and the reference signal $E_R$ are taken, then it is guaranteed that at least 50 cycles of the incident signal $E_I$ will be available for processing after the location of the first positive going zero crossing of the reference signal $E_R$.

In step 668, a basis function for the DFT is derived. The basis function W(n) (where n=0 to N) is a series of N complex numbers corresponding point-by-point to the N samples of the input signal. The basis function W(n) of the DFT in the illustrated embodiment is rotated by −90 degrees (−π/2) relative to the more standard and well known basis function normally used in calculating DFTs. The result of using a phase shifted basis function W(n) is that the real component of the basis function W(n) is a sine function which starts at a positive-going zero crossing, and thus is time aligned, and in phase, with the reference signal $E_R$.

In addition, the time alignment of the samples in the basis function W(n) are adjusted to account for the time displacement $t_{disp}$ between the sample times of the incident signal $E_I$ and the time location of the zero crossing of the reference signal $E_R$, determined as described above. Specifically, the basis function W(n) is calculated as $$W(n) = e^{j\left(n \cdot K \frac{\pi}{2} + t_{disp}\right)}$$

for n=0 to N. In this manner, the basis function is time-aligned with the sample times of the incident signal $E_I$, relative to the zero crossing of the reference signal $E_R$. This series of N numbers is stored in the third buffer 612.

In step 670, a window function w(n) (where n=0 to N) is calculated to be applied to the incident signal $E_I$, starting with the sample at the time location in the incident signal $E_I$ corresponding to the first sample in the reference signal $E_R$ after the zero crossing, as described above. The window function operates in a known manner to scale the incident signal $E_I$ samples processed to form the DFT in such a manner that they start and end at a zero value. In a preferred embodiment, a known Blackman-Harris window function is selected to be applied to the incident signal $E_I$ (n) samples. However, any of the other known window functions, such as the rectangular, Hanning, Hamming, Blackman, Blackman exact or FlatTop window functions may be used instead. One skilled in go the art will understand how to generate a series of N samples representing any of the known window functions, what the differences among these and/or other window functions are, their advantages and disadvantages, and how to select one from among them. One skilled in the art will further understand that the window function w(n) may also be adjusted in time to account for the time displacement $t_{disp}$ between the time of the first positive going zero crossing of the reference signal $E_R$ and the sample time of the first sample of the incident signal $E_I$ after the zero crossing time. The window function w(n) samples are stored in the fourth buffer 614. In addition, a coherent gain CG of the selected window function w(n) must be calculated as well. The coherent gain CG is calculated as $$CG = \frac{1}{N} \cdot \sum_{n=0}^{N-1} w(n).$$

In step 672, the single point DFT, v, is computed in a known manner as $$v = \frac{2}{N \cdot CG} \cdot \sum_{n=0}^{N-1} E_i(n) \cdot W(n) \cdot w(n).$$

The single point DFT, v, is a vector representing the phasor value of the incident signal $E_I$ relative to the reference signal $E_R$. It is expressed as a complex number having a real and an imaginary component v=Re(v)+jIm(v) representing the magnitude and phase of the incident signal $E_I$ relative to the reference signal $E_R$. The amplitude of the incident signal $E_I$ relative to the reference signal $E_R$ is |v| and the phase θ is arg(v).

In step 674, under some circumstances, a null vector n is added to the vector v from the DFT calculation. When the user activates the null control circuit 30 (of FIG. 1), the null vector generator 130' stores the real and imaginary components representing the vector v at the output of the DFT circuit 606 at the time when the null control circuit 30 was activated. The null vector generator 130' then conditions the null vector adding circuit 124' to add a null vector signal n to the vector signal v from the DFT circuit 606 which would result in the display of a point at a predetermined location on the display device 20. For example, in the illustrated embodiment, the predetermined location is the middle of the display device 20, and represents a vector 0.5+j0. Thus, immediately after the null control circuit 30 is activated, v+n=0.5+j0. Thus, n=0.5+j0-v. That is, n=Re(n)+jIm(n), where Re(n)=0.5-Re(v), and Im(n)=-Im(v). The components of this null vector n are stored in the null vector generator 130' and are used to generate a nulled vector at the output of the null vector adding circuit 124'. The result of this nulling operation is a series of complex numbers representing the real and imaginary components of the magnitude and phase of the nulled vector. In the remainder of this description, it is assumed that any desired null vector n has been added to the vector v. The output of the null vector adding circuit 124' will be designated as v in the remainder of this description, whether a null vector n has been added or not.

The real and imaginary components, Re and Im, from the (possibly nulled) DFT calculation are stored in respective circular buffers 608 and 610 (of FIG. 6). In a preferred embodiment, these buffers hold 500 samples each. The buffered the real and imaginary components, Re and Im, may then be scaled, rotated and filtered, as illustrated in FIG. 5, and the resulting samples displayed on the display device 20 (of FIG. 1) with a Smith chart graticule overlaid atop it. Furthermore, the actual values of the impedance, and its reactive and resistive components may be displayed in textual form in a manner to be described below.

Figure 8:
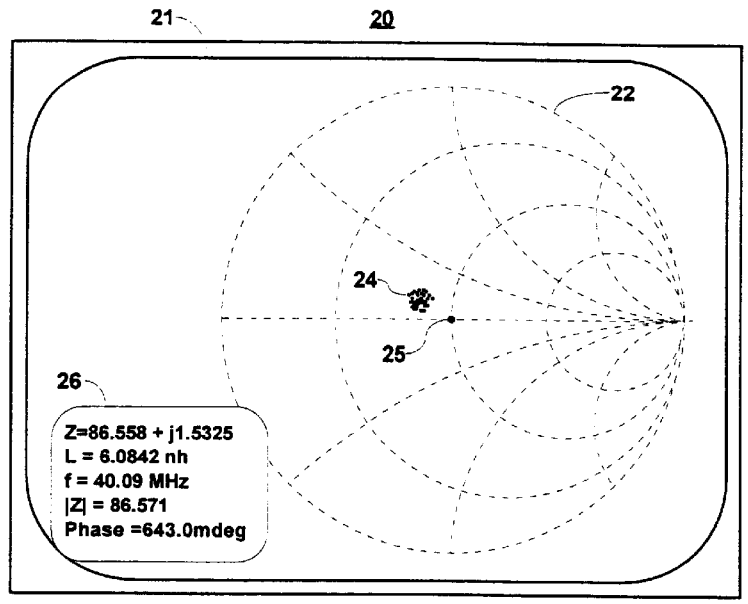
FIG. 8 illustrates an exemplary display, generated by a system according to the present invention, for the display device of FIG 1.

FIG. 8 illustrates an exemplary display image, generated by a system according to the present invention, for the display device 20 (of FIG. 1). In FIG. 8, the display device 20 includes a display screen 21 on which a Smith chart graticule 22 is displayed. A center point 25 in the Smith chart 22 display is the location representing an impedance or 0.5+j0. It is to this location that the process of nulling the display (described in detail above) places the display image. In FIG. 8, a cloud 24 of display points represents the measured and displayed value of an unknown impedance. In the display illustrated in FIG. 8, it is assumed that the display was initially nulled by a 75 ohm resistor, so that the center 25 of the image represents 75+j0.

From the single point DFT, v, the unknown impedance Z (of FIG. 1 may be calculated. These calculations assume two things. First, it is assumed that the incident signal $E_I$ samples have been normalized to the magnitude of the reference signal $E_R$ samples (step 664 of FIG. 7). Second, it is assumed that the value of the resistor R is accurately known at the frequency of the reference signal $E_R$.

The calculations to determine the unknown impedance Z depends on which quadrant the vector v is in, or in other words, the value of the phase θ=arg(v)=arctan(Im/Re). If the value of the phase θ is in quadrant I, i.e. between 0 and π/2 (0° to 90°), or quadrant IV, i.e. between -π/2 and 0 (-90° to 0°), then the following series of computations gives the value of the unknown impedance Z. First, an angle λ is calculated as $$\lambda = \arcsin\left(\frac{|v|\sin\theta}{\sqrt{|v|^2 + 1 - 2 \cdot |v| \cdot \cos\theta}}\right).$$

The magnitude of the unknown impedance Z is calculated as $$|Z| = \frac{R \cdot \sin\lambda}{\sin\theta},$$

while the phase angle of the unknown impedance is calculated as $$arg(Z) = \frac{\pi}{2} - \lambda - \theta.$$

The reactive component X of the unknown impedance Z is calculated as X=|Z|cos(arg(Z)), while the resistive component A is calculated as A=|Z|sin(arg(Z)).

If the value of the phase θ is in quadrant II, i.e. between π/2 and π (90° and 180°), or in quadrant III, i.e. between −π and −π/2 (−180° and −90°), then a different series of calculations gives the value of the unknown impedance Z. First an angle λ is calculated as $$\lambda = \arcsin\left(\frac{|v|\sin\theta}{\sqrt{|v|^2 + 1 - 2 \cdot |v| \cdot \cos\theta}}\right).$$

From this, an intermediate angle γ is calculated as γ=π−λ−θ. An intermediate magnitude value ZZ is calculated as $$ZZ = \frac{R}{\cos\gamma}.$$

From these, an intermediate value AR is calculated as $$AR = \frac{ZZ \cdot \sin\gamma}{\sin\lambda}.$$

The magnitude of the unknown impedance Z is then calculated as $$|Z| = \frac{AR - R}{\cos\lambda},$$

while the phase angle of the impedance is calculated as $$\arg(Z) = \frac{\pi}{2} - \lambda.$$

The reactive component X of the unknown impedance Z is calculated as X=|Z|sinλ, while the resistive component A is calculated as A=|Z|cosλ.

In either case, from the reactive component X, the equivalent discrete component value may be calculated. For example, if the reactive component X is positive, it represents an inductance L, which may be calculated as $$L = \frac{X}{2\pi f}.$$

If the reactive component X is negative, it represents a capacitance C, which may be calculated as $$C = -\frac{1}{2\pi f X}.$$

Referring to FIG. 8, the numerical values for the unknown impedance Z: the real and imaginary components, the magnitude |Z| and phase angle θ=arg(Z), the reactive (X), resistive (A), and the inductive L/capacitive C component value may be displayed on the display device 20 (of FIG. 1) in a display box 26, accompanying the Smith chart graphical display (22,24,25). This information is updated with every DFT performed.

In general, as described above, because of the auto-ranging function of the digital sampling oscilloscope, the user may step through different frequencies, and the Smith chart graphical display on the display device 20 will be updated, as will the textual display of the impedance and its reactive and resistive components. However, if the effect of stray inductance is significant, then the null procedure must be performed for each change in frequency.

Figure 9:
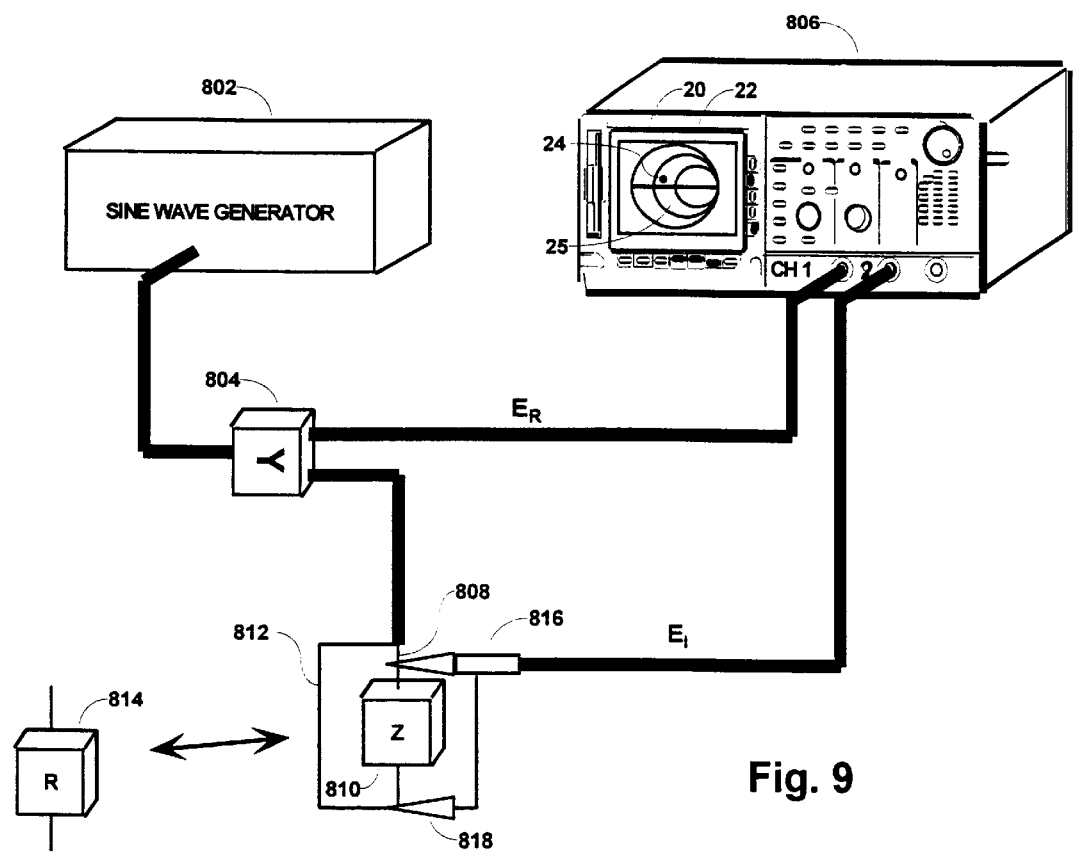
FIG. 9 is a block diagram illustrating a test setup for analyzing an unknown impedance using a digital sampling oscilloscope according to principles of the present invention.

A digital sampling oscilloscope according to the present invention has been described above for determining the value of an unknown impedance. FIG. 9 is a block diagram illustrating an alternative test setup for analyzing the value of an unknown impedance relative to a known impedance using a digital sampling oscilloscope according to principles of the present invention. In FIG. 9, an output terminal of a sine wave generator 802 is coupled to an input terminal of a power splitter 804. A first output terminal of the power splitter 804 carries the reference signal $E_R$, and is coupled to a first input terminal (CH 1) of a digital sampling oscilloscope 806. A second output terminal of the power splitter is coupled to the unknown impedance Z 810. A first connection 808, which may be a center conductor of a coaxial cable, is coupled to a first electrode of the unknown impedance Z 810. A second connection 812, which may be the shield of the coaxial cable, is coupled to a second electrode of the unknown impedance Z 810. A probe 816, which is a high impedance probe, is coupled to a second input terminal (CH 2) of the digital sampling oscilloscope 806. The probe 816 is coupled to the first electrode of the unknown impedance Z 810. A ground connection 818 of the probe 816 is coupled to the second electrode of the unknown impedance Z 810.

In operation, the sine wave generator 802 is conditioned to produce a sine wave signal at a frequency of interest. The connections between the sine wave generator 802 and the splitter 804 and between the splitter and the digital sampling oscilloscope 806 and the unknown impedance 810 are through transmission lines, such as coaxial cables, all having the same characteristic impedance. Furthermore, the respective output and input impedances of the sine wave generator 802, the splitter 804, and the digital sampling oscilloscope 806 also are the characteristic impedance, all in a known manner.

A reference impedance R 814, equal to the characteristic impedance, is substituted for the unknown impedance, as indicated by the arrow in FIG. 9, and the digital sampling oscilloscope 806 conditioned to operate as described above. One of the buttons illustrated on the digital sampling oscilloscope 806 provides the user input necessary to perform the nulling function described in detail above. The nulling function translates the impedance represented by the reference impedance R at the frequency generated by the sine wave generator 802 to the center 25 of the display device 20 in the digital sampling oscilloscope. The reference impedance R 814 is then removed and the unknown impedance Z 810 is inserted in its place, and the digital sampling oscilloscope 806 conditioned to operate in the manner described above. The reference signal $E_R$ represents the signal from the sine wave generator 802 via the power splitter 804, while the incident signal $E_I$ represents the signal across the unknown impedance Z 810. The location 24 on the display screen represents the value of the unknown impedance Z 810 with reference to the reference impedance R 814 at the frequency of the reference signal $E_R$ produced by the sine wave generator 802. This location 24 is superimposed on a Smith chart graticule 22 to aid in interpreting it. The frequency produced by the sine wave generator 802 may be varied by the user to test, in real time, the change in the unknown impedance Z 810 at different frequencies.

Figure 10A:
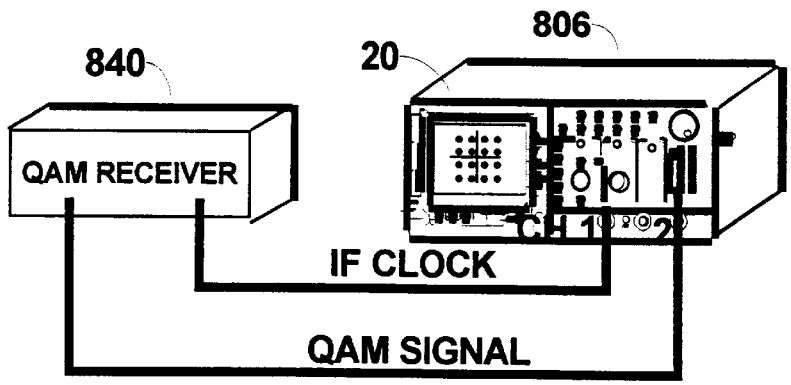
FIG. 10a is a block diagram illustrating a test setup for analyzing a quadrature amplitude modulated (QAM) signal according to principles of the present invention.
Figure 10B:
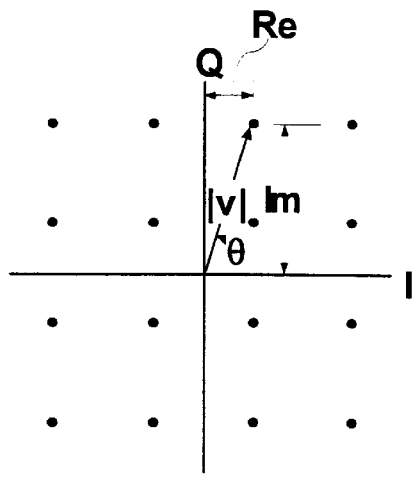
Figure 10C:
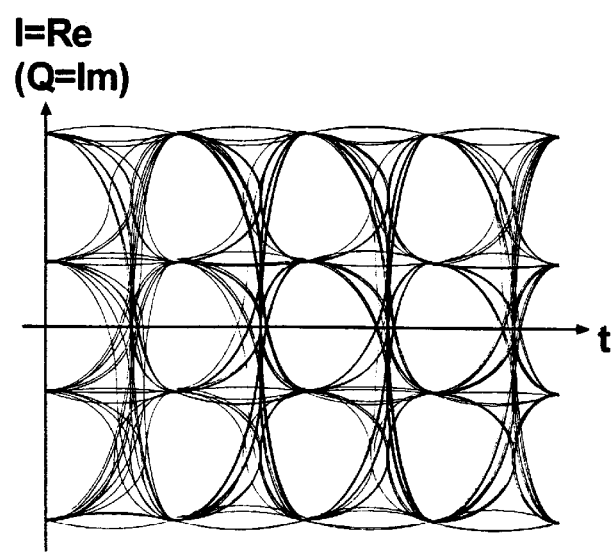

FIG. 10a is a block diagram illustrating a test setup for analyzing a quadrature amplitude modulated (QAM) signal according to principles of the present invention, and FIG. 10b and FIG. 10c are waveform diagrams which may be produced on the display device 20 in the setup illustrated in FIG. 10a. In FIG. 10a, a first output terminal of a QAM receiver 840 produces an intermediate frequency (IF) clock signal and is coupled to the first (CH 1) input terminal of the digital sampling oscilloscope 806. A second output terminal of the QAM receiver 840 produces a QAM signal and is coupled to the second (CH 2) input terminal of the digital sampling oscilloscope 806.

In operation, the QAM receiver 840 receives a QAM modulated signal (not shown) representing a series of symbols, and demodulates it to an IF clock signal, which acts as the reference signal $E_R$, and a QAM signal, which acts as the incident signal $E_I$, all in a known manner. In FIG. 10, a 16QAM signal is illustrated, though the system may be used to analyze any QAM signal, including a quadrature phase shift keyed (QPSK) signal. The phase and magnitude of the QAM signal, with respect to the IF clock signal, gives the location of a received symbol in the complex plane. This location is used to decode the bits represented by the received symbol in a known manner which is not germane to understanding the present invention. FIG. 10b illustrates an exemplary QAM constellation. The digital sampling oscilloscope 806 is configured to operate as described in detail above to produce successive samples representing the real and imaginary components, Re and Im, representing the magnitude |v| and phase θ of the QAM signal with respect to the IF clock signal. This is displayed, after suitable scaling, possibly under the control of the user, directly on the display device 20. In this application, however, the Smith chart graticule is not displayed, though a standard x-y set of axes, similar to those illustrated in FIG. 10b may be overlaid atop the display. By suitable control of persistence of the display, the transitions from constellation point to constellation point may also be observed.

Alternatively, an eye-diagram, as illustrated in FIG. 10c, may be displayed by displaying one of the real and imaginary components, Re and Im, in the vertical direction, with a standard sweep representing time in the horizontal direction. The eye-diagram illustrated in FIG. 10c is the real component Re eye diagram, however one skilled in the art will understand that the imaginary component Im may also be displayed in the same manner.

Another application for a digital sampling oscilloscope according to principles of the present invention is to provide data for a three dimensional display of modulation phase and magnitude versus time for a QAM or QPSK signal. A primary example would be the display of QAM and/or QPSK complex eye patterns, as would be derived by a test setup as illustrated in FIG. 10. As described above, the digital sampling oscilloscope 806 of FIG. 10 generates a series of real and imaginary components, Re and Im, at successive times. These real and imaginary components, Re and Im, may be transformed by suitable processing to generate a three dimensional display of the modulation. This display may be overlaid atop axes respectively representing real (R(t)), imaginary (I(t)) and time (t) dimensions.

Figure 11:
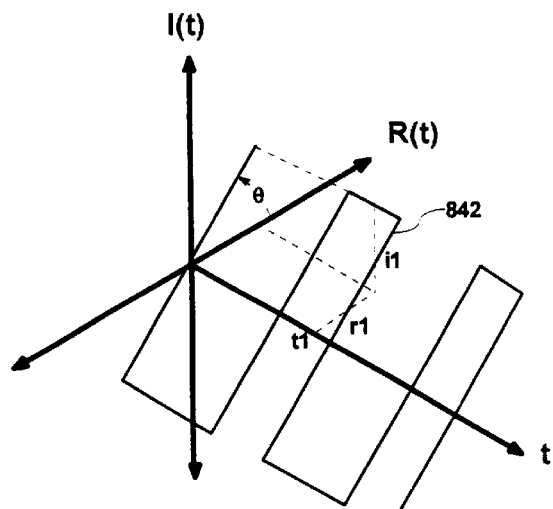
FIG. 11 is a diagram of an alternate display for the results of the analysis of QAM signals.

FIG. 11 is a diagram of such a display for the results of the analysis of a QPSK signal in this manner. Suitable software, of known design, can transform these real and imaginary components, Re and Im, to the display of FIG. 11. For example, at time t1, the real component Re was determined to be r1 and the imaginary component Im was determined to be i1. When suitably transformed, they form part of a waveform 842 displayed in FIG. 11. In the waveform 842 illustrated in FIG. 11, the phase angle θ of the carrier is modulated between +45° and −135°. A software trigger mode that allows triggering to occur on the demodulated signal in order to stabilize the display is further required, and one skilled in the art will understand the requirements and how to program such a trigger.

It is sometimes required for the output impedance of a signal source to be matched to the input impedance of a signal utilization means. This maximizes the power transfer from source to utilization means, and minimizes signal distortion due to reflections caused by impedance mismatches. In such systems, an adjustable impedance matching network is interposed between the signal source and the signal utilization means. The adjustable impedance matching network must be adjusted, or tuned, to properly match the output impedance of the signal source to the input impedance of the utilization means.

Figure 12:
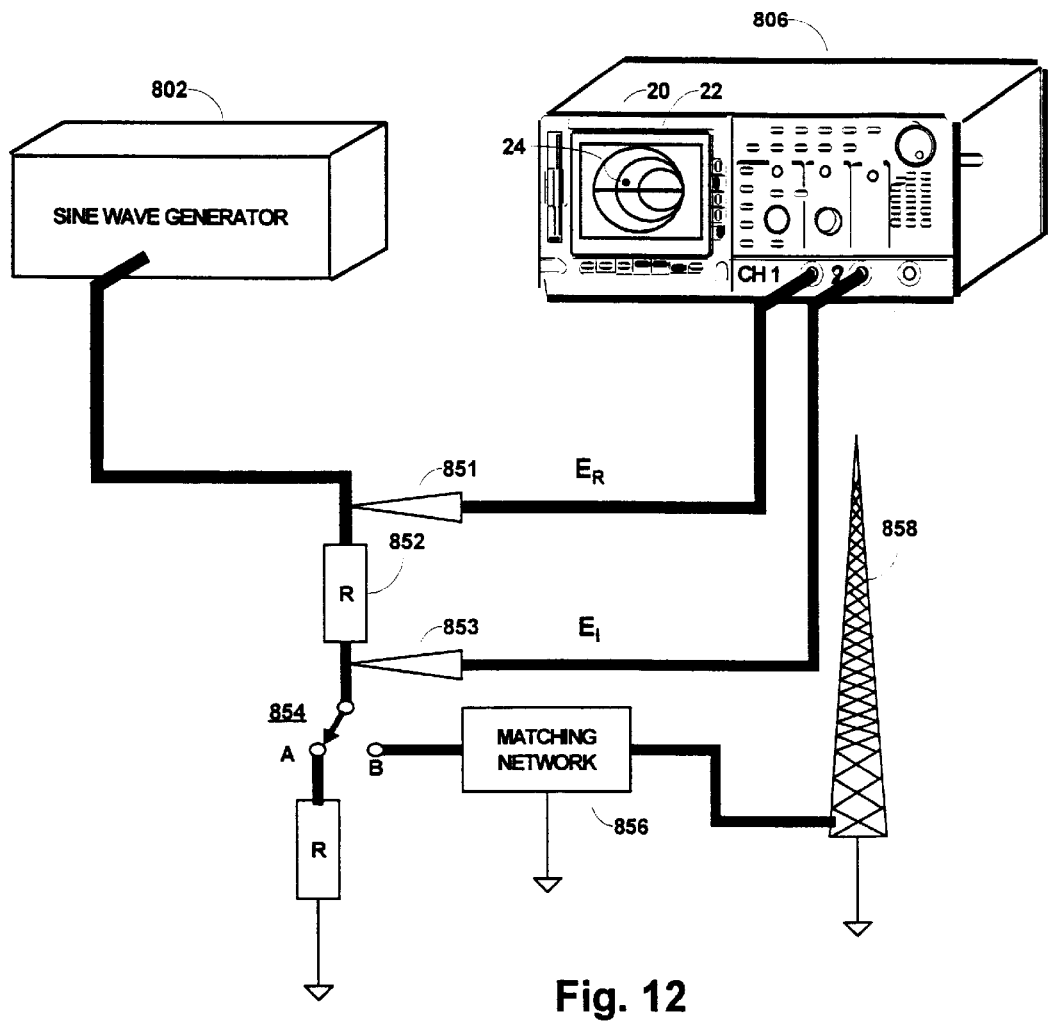
FIG. 12 is a block diagram illustrating a test setup for tuning a matching network for an AM broadcast antenna.

For example, FIG. 12 is a block diagram illustrating a test setup for tuning a matching network for an AM broadcast antenna. In FIG. 12, those elements which are similar to those illustrated in FIG. 9 are designated with the same reference numbers, and are not described in detail below. In FIG. 12, an output terminal of the sine wave generator 802 is coupled to a first electrode of a first reference resistor 852 having a value of R+j0. A second electrode of the first reference resistor 852 is coupled to a pole of a single-pole-double-throw (SPDT) switch 854, and to the second input terminal (CH 2) of the digital sampling oscilloscope 806. A first throw terminal A of the SPDT switch 854 is coupled to a first electrode of a second reference resistor 853, also having a value of R+j0. A second electrode of the second reference resistor 853 is coupled to ground. A second throw terminal B of the SPDT switch 854 is coupled to an input terminal of the matching network 856. An output terminal of the matching network 856 is coupled to a broadcast antenna 858. The matching network 856 and broadcast antenna 858 are both coupled to ground. A first high impedance probe 851 is coupled to the first electrode of the first reference resistor 852. The first high impedance probe 851 is coupled to the channel 1 input terminal of the digital sampling oscilloscope 806. A second high impedance probe 853 is coupled to the second electrode of the first reference resistor 852. The second high impedance probe 853 is coupled to the channel 2 input terminal of the digital sampling oscilloscope 806.

In operation, the values of the first and second reference resistors 852 and 853 are selected to be the desired input impedance of the antenna matching network 856. In the embodiment illustrated in FIG. 12, this is 50+j0 ohms. The sine wave generator 802 is conditioned to produce a sine wave signal at the frequency of interest, which in FIG. 12 will be the carrier frequency of the broadcast RF signal. The SPDT switch 854 is first switched to the A position. The digital sampling oscilloscope 806 analyzes the phase and magnitude of the incident signal $E_I$ with respect to the reference signal $E_R$, as described above. The null button on the digital sampling oscilloscope 806, described above, is then activated. This moves the displayed signal to the center 25 of the display device 20 in the middle of the Smith chart graticule 22. This also compensates for probe impedances and cable length differences. The SPDT switch 854 is then switched to the B position. The signal 24 displayed on the display device 20 indicates the input impedance exhibited by the matching network 856 relative to the desired input impedance 50+j0. The adjustable matching network 856 is then adjusted until the displayed signal 24 is moved to the middle 25 of the Smith chart graticule 22 on the display device 20. When this has been done, the input impedance of the matching network 856 has been adjusted to the same impedance as the second reference resistor 853, or the desired input impedance of 50+j0 ohms.

Figure 13:
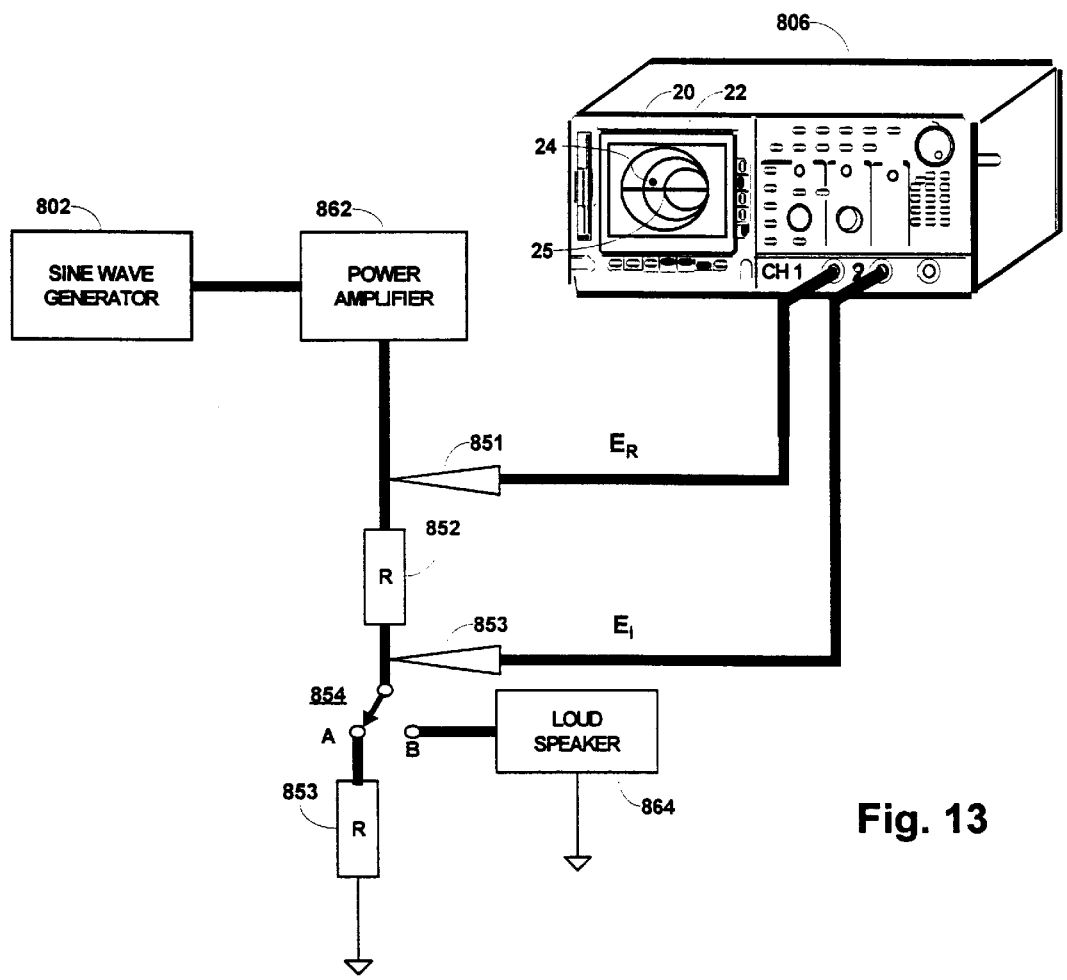
FIG. 13 is a block diagram illustrating a test setup for analyzing the input impedance of a dynamic loudspeaker.

It is also sometimes required to analyze the impedance characteristics of a circuit over a range of frequencies. In addition, it may be required to analyze that impedance characteristics relative to a known, desired, impedance characteristic. For example, FIG. 13 is a block diagram illustrating a test setup for analyzing the input impedance of a dynamic loudspeaker over the range of audio frequencies. In FIG. 13, those elements which are similar to those illustrated in FIG. 12 are designated by the same reference numbers and are not described in detail below. In FIG. 13, the output terminal of the sine wave generator 802 is coupled to an input terminal of a power amplifier 862. An output terminal of the power amplifier 862 is coupled to the first electrode of the first reference resistor 852. The second pole terminal B of the SPDT switch 854 is coupled to an input terminal of a dynamic loudspeaker 864. The dynamic loudspeaker 864 is also grounded.

In operation, the power amplifier 862 is required to drive the dynamic loudspeaker 864 at a reasonable power level. The values of the first and second reference resistors 852 and 853 are selected to be the desired input impedance of the dynamic loudspeaker 864. In the embodiment illustrated in FIG. 13, this is 8+j0 ohms. The SPDT switch 854 is first switched to the A position. The digital sampling oscilloscope 806 analyzes the phase and magnitude of the incident signal $E_I$ with respect to the reference signal $E_R$, as described above. The null button on the digital sampling oscilloscope 806, described above, is then activated. This moves the displayed signal to the center 25 of the display device 20 in the middle of the Smith chart graticule 22. This also compensates for probe impedances and cable length differences (though one skilled in the art will understand that at audio frequencies these are rarely significant). The SPDT switch 854 is then switched to the B position. The signal 24 displayed on the display device 20 indicates the input impedance of the dynamic loudspeaker 864 relative to the desired impedance of 8+j0. The display device 20 is adjusted to a known infinite persistence mode, in a known manner. The sine wave generator 802 is then swept or stepped through the complete audio range, while the resulting display, indicating the input impedance of the dynamic loudspeaker 864 is displayed on the display device 20. The display resulting from sweeping or stepping the frequency over the full audio range of frequencies illustrates the corresponding range of input impedances exhibited by the dynamic loudspeaker over that frequency range.

Another application for a digital sampling oscilloscope according to the present invention is for non-destructive testing of metal parts. The complex impedance plane display and quadrature synchronous detector in the digital sampling oscilloscope, as described above, are the primary architecture for eddy-current non-destructive testing. The purpose of eddy-current testing is to find small cracks or changes in conductivity in materials such as iron, titanium, aluminum, and copper, etc. This process is widely used by the world airlines for testing jet engine turbines and for metal fatigue in structures such as wings and fuselage. It is also used in the nuclear industry, automotive industry, oil pipelines, and armed forces for similar testing purposes.

Figure 14A:
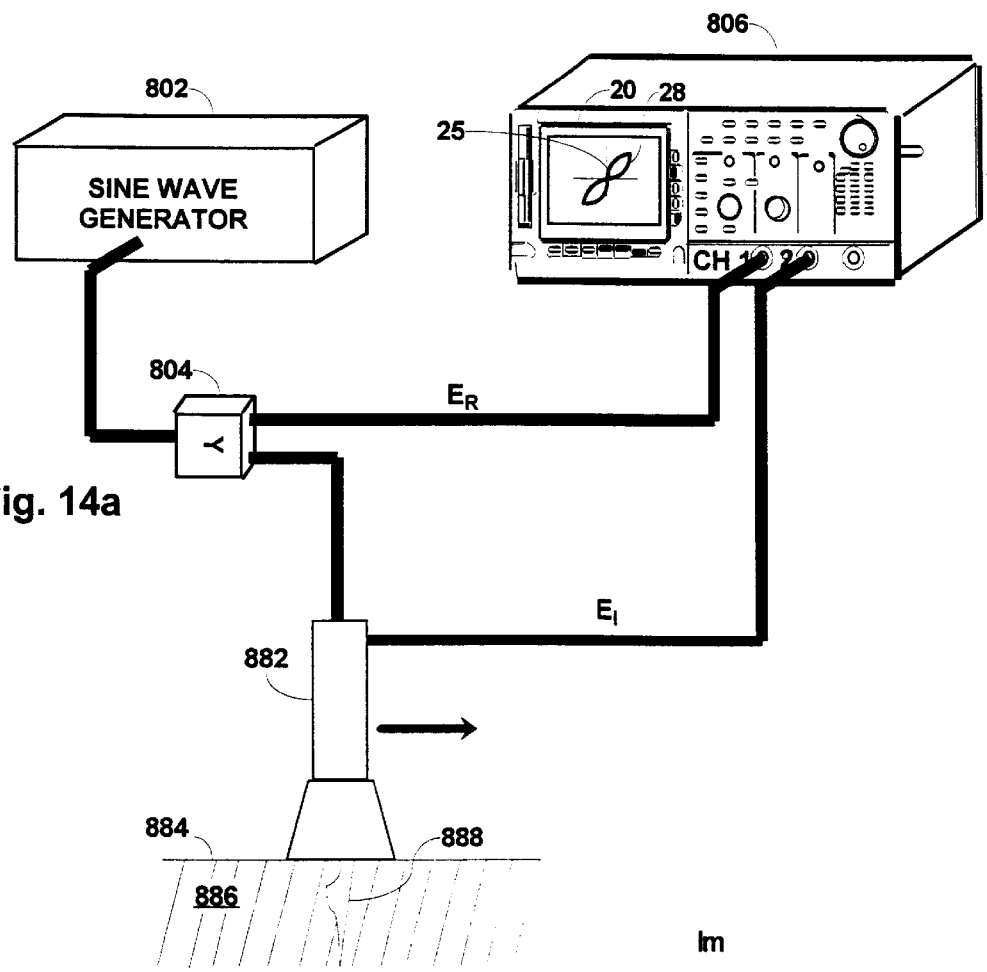
FIG. 14a is a block diagram illustrating a test setup for non-destructive testing of metallic structures and FIG. 14b is a diagram illustrating the display produced when a crack is detected.
Figure 14B:
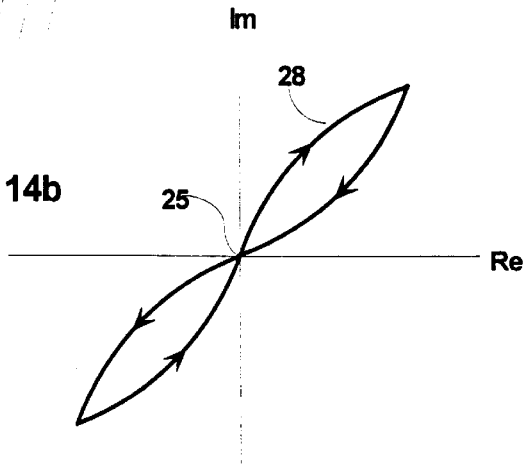

FIG. 14a is a block diagram illustrating a test setup for non-destructive testing of metallic structures and FIG. 14b is a diagram illustrating the display produced when a crack or other such discontinuity in a structure is detected. In FIG. 14a, those elements which are similar to those illustrated in FIG. 9 are designated by the same reference number and are not described in detail below. In FIG. 14a, the second output terminal of the power splitter 804 is coupled to an input terminal of an eddy-current probe 882. An output terminal of the eddy-current probe 882 is coupled to the second input terminal (CH 2) of the digital sampling oscilloscope 806.

In operation, the sine wave generator 802 generates the reference signal $E_R$ having a frequency in the range of 60 Hz to 10 MHz. This signal is applied to the eddy-current probe 882, which comprises a differential pair of coils, arranged and constructed in a known manner. The output signal from the coils in the eddy-current probe 882, i.e. the incident signal $E_I$, will vary in phase and amplitude, relative to the input signal to the coils, i.e. the reference signal $E_R$, according to the impedance variations exhibited by the coils. The impedance exhibited by the coils, in turn, varies depending on the conductivity of the material 886 under test in the neighborhood of the coils. The impedance of the coils is displayed on the display screen 20 of the digital sampling oscilloscope 806.

The sine wave generator 802 is conditioned to produce the reference signal $E_R$ at the desired frequency. The eddy-current probe 882 is then placed on the surface 884 of the material 886 to be tested. The null button on the digital sampling oscilloscope 806 is activated. This sets the location of the display resulting from the impedance exhibited by the coils in the eddy-current probe 882, determined in turn by the conductivity of the material 886 under test in the neighborhood of the eddy-current prove 882, to the center 25 of the display device 20. The eddy-current probe 882 is then moved over the surface 884 of the material 886 being tested, as indicated by the arrow adjacent the eddy current probe 882 in FIG. 14a. So long as the material 886 under test remains substantially homogeneous, the conductivity of the material 886 in the neighborhood of the eddy-current probe 882 will remain constant as the eddy-current probe 882 moves over the material 886, and the display will remain in the center 25 of the display device 20.

If, however, the conductivity of the material 886 in the neighborhood of the eddy-current probe 882 is not homogeneous, as, for example, if a crack 888 is present in the material 886, then when the eddy-current probe 882 is moved over the crack 888, the coils in the eddy-current probe 882 will exhibit a change in impedance. The impedance changes due to the change in conductivity of the material 886, e.g. due to a crack 888, will cause the signal displayed on the display device 20 to deviate away from the center of the screen. The signal resulting from the eddy-current probe 882 passing over a crack 888 may be roughly figure-eight shaped, as illustrated in FIG. 14b and waveform 28 on the display device 20 of FIG. 14a. In the embodiment illustrated in FIG. 14, the high pass filters implemented in the post processing circuitry of FIG. 5 are typically used on the demodulated signal to remove undesired signals due to lift-off of the eddy-current probe 882 from the surface 884 of the material 886 under test. Although the crack 888 illustrated in FIG. 14a is illustrated as being relatively large, one skilled in the art will understand that cracks often exist in materials which are too small to be detected by eye, and the use of the set up illustrated in FIG. 14 is necessary to detect such cracks.

Another application for a digital sampling oscilloscope according to principles of the present invention is for users of electric power who are concerned with the problem of minimizing reactive loads that they connect to the utility power lines. Reactive loads, caused by inductive or capacitive components in the impedance of the equipment connected to the power lines, do not provide any real motive power, but appear as consumption of extra power that shows up on their monthly utility bills.

Figure 15A:
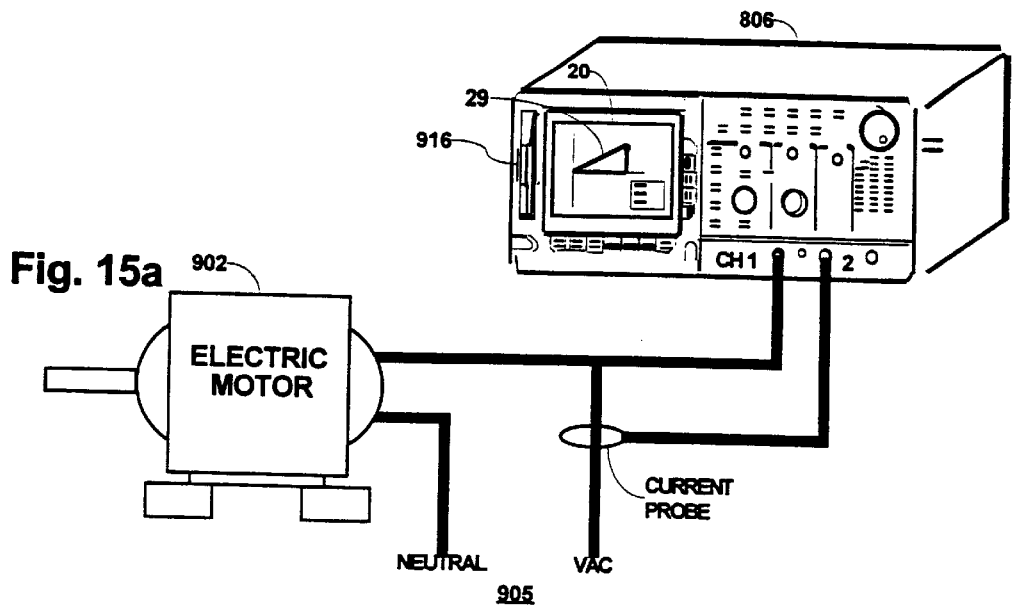

FIG. 15a is a block diagram illustrating a test setup for measuring complex power consumption. In FIG. 15a, a source 905 (not shown) of ac power, such as an electrical utility distribution system provides an ac voltage VAC to an electric motor 902, and to the first input terminal (CH 1) of a digital sampling oscilloscope 806. The power return from the electric motor 902 is coupled to the neutral connection of the power source. A current probe is coupled to the ac voltage source VAC and is coupled to the second input terminal (CH 2) of the digital sampling oscilloscope 806.

In operation, the ac voltage VAC across the electric motor 902 is the reference signal $E_R$, and the current through the VAC power line is the incident signal $E_I$. The digital sampling oscilloscope 806 operates in the manner described above to produce a series of sets of real and imaginary components, Re and Im, representing the phase and magnitude of the current through the electric motor 902 relative to the voltage across the electric motor 902. These real and imaginary components, Re and Im, are displayed on the display device 20, as described below.

Figure 15B:
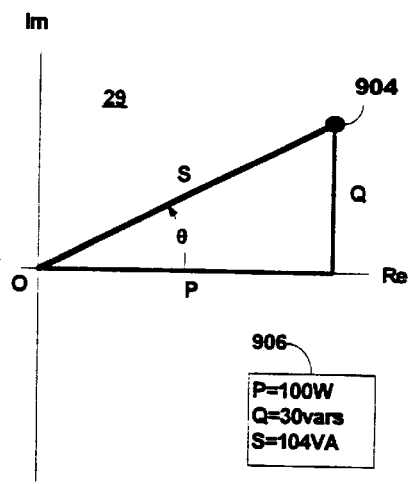

FIG. 15b is a diagram illustrating a first image (29) which may be displayed on the display device 20 of the digital sampling oscilloscope 806. In FIG. 15b, the classic power triangle diagram is displayed and updated in real time. The real axis is horizontal and represents the real power component, the imaginary axis is vertical and represents the reactive power component. A point 904 is displayed at a point represented by the current real and imaginary components, Re and Im. A vector is displayed from the origin O to the point 904. The length of that vector represents the apparent power. This display is updated in real time.

In FIG. 15b, the resulting real and imaginary components, Re and Im, are processed to determine the phase angle between the voltage and current. The phase angle θ between the voltage and current is calculated as θ=arg(v)=arctan(Im/Re), as described above. The true power P may be calculated as P=V·I·cos(θ) in watts, and I is the rms value of the signal from the current probe, and the reactive power Q may be calculated as Q=V·I·sin(θ) in vars (volt-amperes reactive), where V is the peak input voltage (from the reference signal $E_R$), I is the peak input current (from the incident signal $E_I$) and θ is the phase angle between the input voltage and current. The apparent power S may be calculated as $$S = \sqrt{P^2 + Q^2}.$$

This information may also be displayed textually, along with the power triangle, as illustrated in box 906 in FIG. 15b.

Figure 15C:
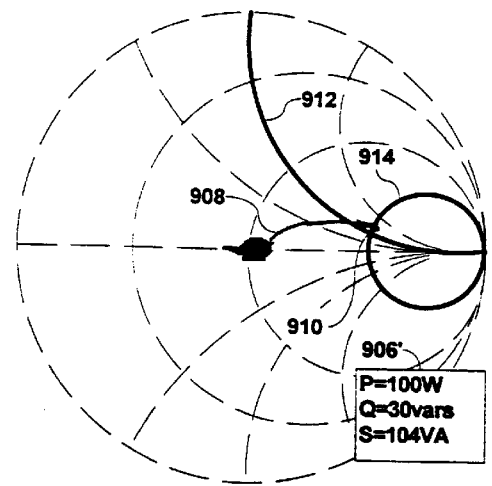

FIG. 15c is a diagram illustrating a second image which may be displayed on the display device 20 of the digital sampling oscilloscope 806. In FIG. 15c, the resulting points, representing the series of real and imaginary components, Re and Im, are displayed overlaying a Smith chart graticule. Using the infinite persistence mode, a record of such points may be maintained on the screen, indicated in gray by the trace 908 in FIG. 15c. In addition a text box 906' includes the instantaneous values of the real power P, the reactive power Q and the apparent power S in textual form.

It is further possible to highlight the circles and arcs in the Smith chart graticule intersecting at the location of the point currently being displayed. Referring to FIG. 15c, the location of the point currently being displayed is 910. The circle 914 and arc 912 which intersect at point 910 are highlighted. This may be done automatically to follow the location of the points as they are displayed; it may be done at predetermined longer time intervals, such as, for example, every ⅓ of a second; or it may be done manually, in response to a user activating a button on the control panel of the digital sampling oscilloscope 806. In response to activating this button, the circle and arc on the Smith chart intersecting at the location of the current point are highlighted and remain highlighted until the next time the button is activated, regardless of changes in the location of the current point. It is further possible for the text box 906' to display the real power P, the reactive power Q and the apparent power S for the manually selected point, rather than following the current point, in this mode of operation.

It is also possible to store the data representing the trace 908 on the disk drive 916 at predetermined time intervals, such as, for example, 10 minutes. If sufficient disk storage is provided, then a complete record of the operation of the electric equipment (e.g. electric motor 902) can be maintained. Another application could easily be developed to make a total composite display over the entire time period in which measurements were made. It would also be possible to play back the complete record, possibly at a speeded up time to see trends which develop over time periods too long to note in real time. It is also possible to be able to step forward and backwards through the stored displays in response to user inputs.

Figure 16:
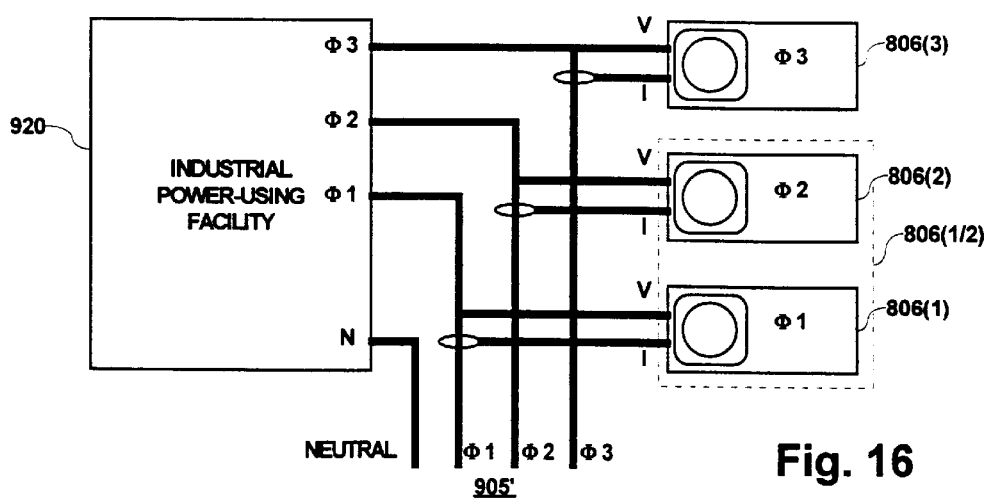
FIG. 16 is a block diagram illustrating a test setup for measuring complex power consumption in an industrial facility using three phase power.

Another application using a digital sampling oscilloscope according to principles of the present invention monitors the reactive power into an industrial facility using three phase power. FIG. 16 is a diagram illustrating a test set up for monitoring reactive power in a three phase system. In FIG. 16, three digital sampling oscilloscopes, 806(1), 806(2) and 806(3) respectively monitor the three phases, Φ1, Φ2 and Φ3 from a power source 905' (not shown). The three phases, Φ1, Φ2 and Φ3 are coupled to respective power input terminals of an industrial power-using facility 920, which possibly consumes a reactive power component. A neutral connection is also coupled between the power source 905' and the power-using facility 920, although one skilled in the art will understand that a delta connection is also possible. Each of the digital sampling oscilloscopes, 806(1), 806(2) and 806(3) has a first input terminal (CH 1) coupled to a respective phase from the power source 905', and a second input terminal (CH 2) coupled to a current probe coupled to that phase. Each of the digital sampling oscilloscopes, 806(1), 806(2) and 806(3) operates in the same manner as the digital sampling oscilloscope 806 in FIG. 15a, producing displays according to FIG. 15b or FIG. 15c. In this manner, the reactive power in each of the three phases may be monitored separately. In addition, as described above, a record of the traces generated by the three digital sampling oscilloscopes, 806(1), 806(2) and 806(3) may be stored on disk drives so that the reactive power may be monitored over a period of time in order to analyze the various loads at different times of the day.

It is also possible to use a single four channel digital sampling oscilloscope to simultaneously monitor two of the three phases. This is illustrated in phantom in FIG. 16 as a dashed box 806(1/2). A second digital sampling oscilloscope 806(3) would be required to monitor the third phase. Several different methods may be used to combine the display of the two phases being simultaneously monitored on a single display device (20). In general, a bit map waveform for each channel would be generated as illustrated in FIG. 15b and/or FIG. 15c, which could be stored on the disk drive and/or displayed by itself on the display device (20). If it is desired to simultaneously display the results from the two phases being monitored, then separate traces, representing a respective one of the phases being monitored, could be displayed at the same time overlaying a single pair of orthogonal axes (FIG. 15b) or a Smith chart graticule (FIG. 15c), and designated by color, intensity, vector line type (solid, dashed, etc.) a textual display, or any other suitable labeling method. The results for each phase could be continuously combined into a single bit map on each acquisition in an infinite persistence mode. Otherwise each result could be displayed as it is received.

An alternative would be to use a split screen, with two sets of orthogonal axes, for two channel operation. This would allow easier identification of which trace represents which phase. However, each display will half of the size of a single display lowering the resolution of that display.

An advantage of using digital sampling oscilloscopes according to principles of the present invention to monitor complex power consumption is that it can display a trace of real time variations in the complex load impedance. This would be especially valuable, for example, in analyzing the start up characteristics of the motor and in analyzing the system under varying mechanical load conditions.

Yet another applications for a digital sampling oscilloscope according to principles of the present invention is for network analysis. By using the proper power splitters and/or directional couplers the digital sampling oscilloscope may be used to measure network characteristics in a similar manner to network analyzers. By nulling the digital sampling oscilloscope and stepping the frequency, the impedance may be measured in the manner described in detail above. The final results may be overlaid on a Smith chart impedance plot, or a Bode plot, or a polar Nyquist plot, all in a known manner. This method of stepping the frequency and using a digital sampling oscilloscope according to the present invention has the advantage over step or impulse response testing for measuring a servo system that the reference signal $E_R$ from e.g. the sine wave generator (802 of FIG. 9) may be set to different levels at different frequencies. This allows for better signal to noise ratio for each frequency at which the measurement is taken. This kind of measurement process may be used e.g. for DVD drive and standard disk drive servo systems.

What is claimed is:

1. A system for determining the phase and magnitude of an incident signal relative to a cyclical reference signal, comprising:

a sampler for sampling the incident signal;

autoranging circuitry responsive to the reference signal for determining the frequency f of the reference signal and for setting the sampling rate sr of the sampler;

a processor, responsive to the sampler, for computing a single point DFT v of the sampled incident signal responsive to the frequency of the reference signal and for determining the phase θ and magnitude |v| of the incident signal relative to the reference signal in response to the single point DFT.

2. The system of claim 1 wherein:

the sampler further samples the reference signal at time locations corresponding to sample times of the incident signal; and the processor comprises:

zero-crossing detecting circuitry, for detecting the time location of the first positive-going zero crossing in the reference signal;

sample selection circuitry for selecting a gate duration of the N samples of the incident signal immediately after the time location of the detected zero-crossing location of the reference signal; and circuitry for calculating the single point DFT v on the selected incident signal samples.

3. The system of claim 2 wherein the processor further comprises:

circuitry for locating a first reference signal sample immediately before the zero crossing;

circuitry for locating a second reference signal sample immediately after the zero crossing;

circuitry for estimating the time location of the zero crossing responsive to the values of the first and second samples; and circuitry for calculating a time displacement $t_{disp}$ representing the time duration from the estimated time location of the zero crossing and the time location of the second sample.

4. The system of claim 1 wherein the processor further comprises circuitry for calculating a basis function W having a real component in phase with the reference signal, and computes the single point DFT v responsive to the basis function W.

5. The system of claim 4 wherein:

the autoranging circuitry comprises circuitry for setting a gate duration of N samples and the sampling rate sr such that at least a predetermined number M of cycles, and a predetermined number of samples in each cycle of the reference signal are taken within the gate duration N;

the sampler further samples the reference signal at time locations corresponding to sample times of the incident signal; and the processor comprises:

zero-crossing detecting circuitry, for detecting the time location of the first positive-going zero crossing in the reference signal, comprising:

circuitry for locating a first reference signal sample immediately before the zero crossing;

circuitry for locating a second reference signal sample immediately after the zero crossing;

circuitry for estimating the time location of the zero crossing responsive to the values of the first and second samples; and circuitry for calculating a time displacement $t_{disp}$ representing the time duration from the estimated time location of the zero crossing and the time location of the second sample;

sample selection circuitry for selecting N samples of the incident signal immediately after the time location of the detected zero-crossing location of the reference signal; and circuitry for calculating the single point DFT v of the selected incident signal samples, comprising:

circuitry for calculating an index K as $$K = \frac{\pi \cdot sr}{N \cdot f};$$

and a basis function W calculating circuitry calculates the basis function W as $$W(n) = e^{j \left( n \cdot K - \frac{\pi}{2} + t_{disp} \right)}$$

where n=0 to N.

6. The system of claim 5 wherein the single point DFT calculating circuitry calculates the single point DFT v as $$v = \sum_{n=0}^{N-1} E_i(n) \cdot W(n).$$

7. The system of claim 5 wherein:
the single point DFT calculating circuitry further comprises circuitry for calculating a window function w(n) and calculates the single point DFT v as $$v = \sum_{n=0}^{N-1} E_i(n) \cdot W(n) \cdot w(n).$$

8. The system of claim 7 wherein the single point DFT calculating circuitry further comprises:
circuitry for calculating a coherent gain CG as $$CG = \frac{1}{N} \cdot \sum_{n=0}^{N-1} w(n);$$

and
calculates the single point DFT v as $$v = \frac{2}{N \cdot CG} \sum_{n=0}^{N-1} E_i(n) \cdot W(n) \cdot w(n).$$

9. The system of claim 7 wherein the window function w is a function selected from the group consisting of the Blackman-Harris, rectangular, Hanning, Hamming, Blackman, Blackman exact and FlatTop window functions.

10. The system of claim 1 wherein the processor further comprises circuitry for calculating a window function w, and computes the single point DFT v responsive to the window function.

11. The system of claim 10 wherein the window function w is a function selected from the group consisting of the Blackman-Harris, rectangular, Hanning, Hamming, Blackman, Blackman exact and FlatTop window functions.

12. The system of claim 1 wherein the processor comprises:
calculating circuitry for calculating the single point DFT v having a real component Re and an imaginary component Im;
circuitry for determining the phase θ as $$\theta = \arg(v) = \arctan\left(\frac{\text{Im}}{\text{Re}}\right);$$

and
circuitry for determining the magnitude |v| as $$|v| = \sqrt{\text{Re}^2 + \text{Im}^2}.$$

13. The system of claim 1 wherein the autoranging circuitry comprises circuitry for setting a gate duration of N samples and the sampling rate sr such that at least a predetermined number M of cycles, and a predetermined number of samples in each cycle, of the reference signal are taken within the gate duration N.

14. The system of claim 13 wherein the sample rate sr is calculated as at least $$sr \geq \frac{f \cdot N}{M}.$$

15. The system of claim 13 wherein the gate duration N is substantially 5000 samples, the predetermined number M of cycles is substantially 50 cycles, and the predetermined number of samples in each cycle is substantially 100 samples.

16. The system of claim 1 wherein the processor comprises circuitry, responsive to the single point DFT v, for selectively nulling the single point DFT v to a predetermined value, in response to a user input.

17. The system of claim 16 wherein the nulling circuitry comprises:
a null vector generator, responsive to the single point DFT v, for generating a null vector n such that the sum of the null vector n and the single point DFT v is the predetermined value; and
a null vector adder, for adding the null vector n to the single point DFT v.

18. The system of claim 17 wherein:
the null vector generator comprises:
circuitry for storing null scalars representing the real and imaginary components of the single point DFT v; and
circuitry for generating the null vector n such that the sum of the null vector n and a vector represented by the stored real and imaginary components represent the predetermined value; and
the null vector adder comprises a first adder for adding the real component of the null vector n to the real component of the single point DFT v and a second adder for adding the imaginary component of the null vector n to the imaginary component of the single point DFT v.

19. The system of claim 16 wherein the nulling circuitry comprises:
a null vector generator, responsive to the single point DFT v, for generating a null vector n; and
a null vector adder, for adding the null vector n to the incident signal before the single point DFT v is computed.

20. The system of claim 19 wherein the null vector generator comprises:
a null scalar generator, coupled to the processor, and responsive to the single point DFT v, for storing null scalars representing the real and imaginary components of the single point DFT; and
a complex modulator, responsive to the reference signal and the null scalar generator, for producing the null vector.

21. The system of claim 1 wherein the system is embodied in a digital sampling oscilloscope.

22. The system of claim 21 wherein the digital sampling oscilloscope comprises a display device for displaying an image representing the phase θ and magnitude |v| of the incident signal relative to the reference signal.

23. The system of claim 22 wherein the digital sampling oscilloscope further comprises circuitry for displaying a graticule overlaying the phase θ and magnitude |v| image.

24. The system of claim 23 wherein the graticule displaying circuitry overlays a Smith chart graticule on the phase θ and magnitude |v| representative image.

25. In a digital sampling oscilloscope, a method for determining the phase and magnitude of an incident signal relative to a cyclical reference signal, comprising the steps of:

conditioning the digital sampling oscilloscope to operate in an autoranging mode and to determine the frequency f of the reference signal;

sampling the incident signal;

computing a single point DFT v of the sampled incident signal responsive to the frequency f of the reference signal; and determining the phase θ and magnitude |v| of the incident signal relative to the reference signal in response to the single point DFT v.

26. The method of claim 25 wherein the step of conditioning the digital sampling oscilloscope to operate in the autoranging mode comprises the step of conditioning the digital sampling oscilloscope to determine a gate duration of N samples and a sampling rate sr such that at least a predetermined number M of cycles, and a predetermined number of samples in each cycle, of the incident signal are taken within the gate duration N.

27. The method of claim 26 wherein the sample rate sr is calculated as $$sr \geq \frac{f \cdot N}{M}.$$

28. The method of claim 26 further comprising the steps of:

taking at least N samples of the reference signal at the sampling rate sr at respective sample times; and locating the first positive going zero crossing in the at least N samples representing the reference signal; and wherein the step of sampling the incident signal comprises the step of taking at least N samples of the incident signal at the sampling rate sr at respective sampling times corresponding to sample times of the N samples of the reference signal;

the step of computing the single point DFT comprises the steps of:

selecting as a first sample $E_i(0)$ of the incident signal representative samples the sample at the time corresponding to the first positive-going zero crossing of the reference signal;

further selecting N succeeding incident signal samples $E_i(n)$ where n=1 to N; and calculating the single point DFT using the selected samples of the incident signal.

29. The method of claim 28 wherein the step of locating the first positive going zero crossing in the reference signal representative samples comprises the steps of:

locating a first reference signal sample at a sample time immediately before the positive going zero crossing;

locating a second reference signal sample at a sample time immediately after the positive going zero crossing;

estimating the time location of the zero crossing in response to the values of the first and second samples;

calculating a time displacement $t_{disp}$ between the estimated time location of the zero crossing and the sample time of the second sample.

30. The method of claim 29 wherein the DFT computing step comprises the steps of:

deriving a basis function W responsive to the frequency of the reference signal;

computing the single point DFT of the incident signal responsive to the basis function W.

31. The method of claim 30 wherein the step of deriving a basis function W comprises the step of deriving a complex basis function W having a real component in phase with the reference signal.

32. The method of claim 30 wherein the step of deriving a basis function W comprises the steps of:

determining an index K in response to the frequency of the reference signal; and deriving the basis function W responsive to the index K.

33. The method of claim 32 wherein the step of determining the index K comprises the step of calculating $$K = \frac{\pi \cdot sr}{N \cdot f}.$$

34. The method of claim 33 wherein the step of deriving the basis function W comprises the step of calculating the basis function $$W(n) = e^{j\left(n \cdot K - \frac{\pi}{2} + t_{disp}\right)}$$

where n=0 to N.

35. The method of claim 34 wherein the step of calculating the single point DFT v comprises the step of calculating $$v = \sum_{n=0}^{N-1} E_i(n) \cdot W(n).$$

wherein $E_i(n)$ is the $n^{th}$ one of the N selected incident signal samples.

36. The method of claim 34 wherein the step of calculating the single point DFT v further comprises the step of applying a window function w(n), where n=0 to N, to the selected incident signal samples $E_i(n)$.

37. The method of claim 36 wherein the window function w(n) is a function selected from the group consisting of the Blackman-Harris, rectangular, Hanning, Hamming, Blackman, Blackman exact and FlatTop window functions.

38. The method of claim 37 wherein the step of calculating the single point DFT v comprises the step of calculating $$v = \sum_{n=0}^{N-1} E_i(n) \cdot w(n) \cdot W(n)$$

wherein $E_i(n)$ is the $n^{th}$ one of the N selected incident signal samples.

39. The method of claim 38 wherein the step of calculating the single point DFT v further comprises the steps of:

calculating a coherent gain CG as $$CG = \frac{1}{N} \cdot \sum_{n=0}^{N-1} w(n);$$

and calculating the single point DFT v as $$v = \frac{2}{N \cdot CG} \sum_{n=0}^{N-1} E_i(n) \cdot w(n) \cdot W(n).$$

40. The method of claim 39 wherein the step of conditioning the digital sampling oscilloscope to operate in the autoranging mode conditions the digital sampling oscilloscope to set the gate duration N to at least 5000 samples, to set M to substantially 50, and to set the sampling rate sr set so that the predetermined number of samples in each cycle of the reference signal is substantially 100.

41. The method of claim 26 wherein the gate duration N is set to at least 5000 samples, the predetermined number M of cycles is around 50, and the sampling rate sr is set so that substantially 100 samples are taken per cycle of the reference signal.

42. The method of claim 25 wherein the step of determining the phase θ and magnitude |v| of the incidence signal relative to the reference signal comprises the steps of:

determining the phase θ as $$\theta = \arg(v) = \arctan\left(\frac{Im}{Re}\right);$$

and
determining the magnitude |v| as $$|v| = \sqrt{Re^2 + Im^2},$$

where Re is the real component of the single point DFT v and Im is the imaginary component of the single point DFT v.

43. The method of claim 25 further comprising the step of selectively nulling the phase θ and magnitude |v| of the incident signal relative to the reference signal to a predetermined value in response to a user input.

44. The method of claim 43 wherein the selective nulling step comprises the steps of:
sampling the single point DFT v of the sampled incident signal in response to the user input;
generating a null vector n, responsive to the sampled single point DFT v, such that when the null vector is added to the sampled single point DFT v, the result is a predetermined value;
adding the null vector n to the single point DFT v of the sampled incident signal.

45. The method of claim 43 wherein the selective nulling step comprises the steps of:
sampling the single point DFT v of the sampled incident signal in response to the user input to produce null scalars;
generating a null vector, responsive to the null scalars, such that when the null vector is added to the incident signal, the resulting single point DFT v is a predetermined value;
adding the null vector to the incident signal before computing the single point DFT v.

46. The method of claim 45 wherein the step of generating a null vector comprises the steps of:
complex modulating the null scalars by the reference signal; and
generating a null vector signal as the magnitude of the complex modulated null scalar signal.

47. The method of claim 25 further comprising the step of displaying an image on a display device in the digital sampling oscilloscope representing the phase θ and magnitude |v| of the incident signal relative to the reference signal.

48. The method of claim 47 wherein the displaying step further comprises the step of overlaying the phase θ and magnitude |v| image with an image of a graticule.

49. The method of claim 48 wherein the overlaying step comprises the step of overlaying the phase θ and magnitude |v| image with the image of a Smith chart graticule.

50. A system for measuring an unknown impedance Z comprising:
a source of a cyclical reference signal;
a series connection of a known reference resistance R and the unknown impedance Z coupled between the reference signal source and a source of reference potential (ground) wherein the junction of the reference resistance R and the unknown impedance Z generates an incident signal;
circuitry, responsive to the incident signal and the reference signal, for determining the phase and magnitude of an incident signal relative to a cyclical reference signal, comprising:
a sampler for sampling the incident signal;
autoranging circuitry responsive to the reference signal for determining the frequency f of the reference signal and for setting the sampling rate sr of the sampler;
a processor, responsive to the sampler, for computing a single point DFT v of the sampled incident signal responsive to the frequency of the reference signal and for determining the phase θ and
magnitude |v| of the incident signal relative to the reference signal in response to the single point DFT; and
circuitry for calculating the unknown impedance responsive to the reference resistance R, the phase θ and the magnitude |v|.

51. The system of claim 50 wherein the calculating circuitry comprises:
circuitry for evaluating the value of the phase θ, and if the phase θ is between 0 and π/2 or between –π/2 and 0, then:
calculating an intermediate angle λ as $$\lambda = \arcsin\left(\frac{|v|\sin\theta}{\sqrt{|v|^2 + 1 - 2\cdot|v|\cdot\cos\theta}}\right);$$

calculating the magnitude of the unknown impedance |Z| as $$|Z| = \frac{R\cdot\sin\lambda}{\sin\theta};$$

and
calculating the phase angle of the unknown impedance is calculated as $$\arg(Z) = \frac{\pi}{2} - \lambda - \theta;$$

otherwise, if the phase θ is between π/2 and π or between –Π/2 and –π, then:
calculating an intermediate angle γ as γ=π–λ–θ;
calculating an intermediate magnitude value ZZ as $$ZZ = \frac{R}{\cos\gamma};$$

calculating an intermediate value AR as $$AR = \frac{ZZ \cdot \sin\gamma}{\sin\lambda};$$

calculating the magnitude |Z| of the unknown impedance Z as $$|Z| = \frac{AR - R}{\cos\lambda};$$

and calculating the phase angle arg(Z) of the unknown impedance Z as $$\arg(Z) = \frac{\pi}{2} - \lambda.$$

52. The system of claim 51 wherein the calculating circuitry further comprises:
   circuitry for calculating the reactive component X of the unknown impedance Z as X=|Z|cos(arg(Z)); and
   circuitry for calculating the resistive component A of the unknown impedance Z as A=|Z|sin(arg(Z)).

53. The system of claim 50 further comprising a display device, coupled to the calculating circuitry, for generating an image representing the phase θ and magnitude |v|.

54. A system for measuring a characteristic of a quadrature amplitude modulated (QAM) signal, comprising:
   a source of a QAM signal and a clock signal synchronized to the QAM signal;
   a sampler for sampling the QAM signal;
   autoranging circuitry responsive to the clock signal for determining the frequency f of the clock signal and for setting the sampling rate sr of the sampler;
   a processor, responsive to the sampler, for computing a single point DFT v of the sampled QAM signal responsive to the frequency of the clock signal; and
   determining the characteristic of the QAM signal responsive to the single point DFT v.

55. The system of claim 54 wherein:
   the characteristic of the QAM signal is the eye diagram;
   the processor generates the single point DFT as a complex value having a real component and an imaginary component; and the system further comprises:
      a display device for displaying an image having a horizontal location corresponding to time and a vertical location corresponding to the value of one of the real and imaginary components.

56. The system of claim 54 wherein:
   the characteristic of the QAM signal is the constellation;
   the processor generates the single point DFT as a complex value having a real component and a imaginary component; and the system further comprises:
      a display device for displaying an image having a horizontal location corresponding to the value of the real component and a vertical location corresponding to the value of the imaginary component.

57. A system for analyzing the value of an unknown impedance relative to a known impedance, comprising:
   a source of a cyclical reference signal;
   a power splitter, having an input terminal coupled to the reference signal source and first and second output terminals;
   an impedance connector, having a first electrode, coupled to the first output terminal of the power splitter and generating the incident signal, and a second electrode coupled to a source of reference potential (ground), the impedance connector being capable of connecting one of the known impedance and the unknown impedance across the first and second electrodes;
   a sampler, comprising a high impedance probe responsive to the incident signal, for sampling the incident signal;
   autoranging circuitry, coupled to the second output terminal of the power splitter, for determining the frequency f of the reference signal and for setting the sampling rate sr of the sampler;
   a processor, responsive to the sampler, for computing a single point DFT v of the sampled incident signal responsive to the frequency of the reference signal and for determining the phase θ and magnitude |v| of the incident signal relative to the reference signal in response to the single point DFT, including circuitry, responsive to the single point DFT v, for selectively nulling the single point DFT v in response to a user input, and a display device for displaying an image representing the phase θ and magnitude |v| of the incident signal relative to the reference signal.

58. The system of claim 57 wherein:
   the reference signal source comprises an output terminal configured to exhibit an output impedance equal to a characteristic impedance;
   the input terminal of the power splitter is coupled to the output terminal of the reference signal source and is configured to exhibit an input impedance equal to the characteristic impedance, and the first and second output terminals of the power splitter are both configured to exhibit an output impedance equal to the characteristic impedance;
   the autoranging circuitry comprises an input terminal configured to have an input impedance equal to the characteristic impedance;
   the known impedance is equal to the characteristic impedance; and
   respective connections between the reference signal source and the power splitter, and between the power splitter and the autoranging circuitry are transmission lines exhibiting the characteristic impedance.

59. A method of operating the impedance analyzing system of claim 57, comprising the steps of:
   connecting the known impedance across the first and second electrodes of the impedance connector;
   computing the single point DFT v of the incident signal relative to the reference signal;
   accepting user input to null the single point DFT v;
   displaying an image at a location representing the phase θ and magnitude |v| of the single point DFT v of the nulled incident signal relative to the reference signal;
   connecting the unknown impedance across the first and second electrodes of the impedance connector;
   computing the single point DFT v of the nulled incident signal relative to the reference signal; and
   displaying an image at a location representing the phase and magnitude of the unknown impedance relative to the known impedance.

60. A system for tuning a matching network, comprising:
   a source of a sine wave reference signal;
   a signal utilization circuit;

a first reference resistor, having a first electrode coupled to the reference signal source and a second electrode generating an incident signal;

a single-pole-double-throw (SPDT) switch having a fixed terminal coupled to the second electrode of the first reference resistor R, a first movable terminal, and a second movable terminal;

a second reference resistor, having a first electrode coupled to the first movable terminal of the SPDT switch, and a second electrode coupled to a source of reference potential (ground);

an adjustable matching network coupled between the second movable terminal of the SPDT switch and the utilization circuit;

a sampler, comprising a high impedance probe responsive to the incident signal, for sampling the incident signal;

autoranging circuitry, comprising a high impedance probe coupled to the reference signal source, for determining the frequency f of the reference signal and for setting the sampling rate sr of the sampler;

a processor, responsive to the sampler, for computing a single point DFT v of the sampled incident signal responsive to the frequency of the reference signal and for determining the phase θ and magnitude |v| of the incident signal relative to the reference signal in response to the single point DFT, including circuitry, responsive to the single point DFT v, for selectively nulling the single point DFT v in response to a user input, and a display device for displaying an image representing the phase θ and magnitude |v| of the incident signal relative to the reference signal.

61. A method of operating the matching network tuning system of claim 60, comprising the steps of:

operating the SPDT switch to couple the second electrode of the first reference resistor to the first electrode of the second reference resistor;

computing the single point DFT v of the incident signal relative to the reference signal;

accepting user input to null the single point DFT v;

displaying an image at a location representing the phase θ and magnitude |v| of the single point DFT v of the nulled incident signal relative to the reference signal;

operating the SPDT switch to couple the second electrode of the first reference resistor to the input terminal of the adjustable matching network;

computing the single point DFT v of the nulled incident signal relative to the reference signal;

displaying an image at a location representing the phase θ and magnitude |v| of the single point DFT v of the incident signal relative to the reference signal; and adjusting the adjustable antenna matching network until the displayed image representing the phase θ and magnitude |v| of the incident signal relative to the reference signal is placed at the location representing the nulled incident signal.

62. A system for analyzing the impedance characteristic of a utilization circuit over a range of frequencies, comprising:

a source of a sine wave reference signal;

a first reference resistor, having a first electrode coupled to the reference signal source and a second electrode generating an incident signal;

a single-pole-double-throw (SPDT) switch having a fixed terminal coupled to the second electrode of the first reference resistor R, a first movable terminal, and a second movable terminal;

a second reference resistor, having a first electrode coupled to the first movable terminal of the SPDT switch, and a second electrode coupled to a source of reference potential (ground);

the utilization circuit coupled to the second movable terminal of the SPDT switch;

a sampler, comprising a high impedance probe responsive to the incident signal, for sampling the incident signal;

autoranging circuitry, comprising a high impedance probe coupled to the reference signal source, for determining the frequency f of the reference signal and for setting the sampling rate sr of the sampler;

a processor, responsive to the sampler, for computing a single point DFT v of the sampled incident signal responsive to the frequency of the reference signal and for determining the phase θ and magnitude |v| of the incident signal relative to the reference signal in response to the single point DFT, including circuitry, responsive to the single point DFT v, for selectively nulling the single point DFT v in response to a user input, and a display device for displaying an image representing the phase θ and magnitude |v| of the incident signal relative to the reference signal.

63. A method of operating the impedance analyzing system of claim 62, comprising the steps of:

operating the SPDT switch to couple the second electrode of the first reference resistor to the first electrode of the second reference resistor;

computing the single point DFT v of the incident signal relative to the reference signal;

accepting user input to null the single point DFT v;

displaying an image at a location representing the phase θ and magnitude |v| of the single point DFT v of the nulled incident signal relative to the reference signal;

operating the SPDT switch to couple the second electrode of the first reference resistor to the input terminal of the adjustable matching network;

computing the single point DFT v of the incident signal relative to the reference signal;

displaying an image at a location representing the value of the unknown impedance relative to the value of the known impedance; and varying the frequency while continually repeating the steps of computing the single point DFT and displaying an image at a location representing the value of the unknown impedance relative to the value of the known impedance.

64. A system for detecting cracks in a material, comprising:

a source of a cyclical reference signal;

a power splitter, having an input terminal coupled to the reference signal source and first and second output terminals;

an eddy current probe, having an input terminal coupled to the first output terminal of the power splitter, and an output terminal producing an incident signal, and including circuitry exhibiting a change in impedance in response to a change in the conductivity of neighboring material;

a sampler for sampling the incident signal;

autoranging circuitry, coupled to the second terminal of the power splitter, for determining the frequency f of the reference signal and for setting the sampling rate sr of the sampler;

a processor, responsive to the sampler, for computing a single point DFT v of the sampled incident signal responsive to the frequency of the reference signal and for determining the phase θ and magnitude |v| of the incident signal relative to the reference signal in response to the single point DFT, including circuitry, responsive to the single point DFT v, for selectively nulling the single point DFT v in response to a user input, and a display device for displaying an image representing the phase θ and magnitude |v| of the incident signal relative to the reference signal.

65. A method of operating the crack detecting system of claim 64, comprising the steps of:

placing the eddy current probe adjacent the material;

computing the single point DFT v of the incident signal relative to the reference signal;

accepting user input to null the single point DFT v;

displaying an image at a location representing the phase θ and magnitude |v| of the single point DFT v of the nulled incident signal relative to the reference signal;

computing the single point DFT v of the incident signal relative to the reference signal;

displaying an image at a location representing the value of the impedance of the eddy current probe; and moving the eddy current probe along the surface of the material while continually repeating the steps of computing the single point DFT and displaying an image at a location representing the value of the impedance of the eddy current probe, wherein if the conductivity of the material in the neighborhood of the eddy current probe changes, the location of the image changes.

66. A system for monitoring complex power consumption, comprising:

a source of ac power including a supply terminal, producing a reference signal, and a return terminal;

a power consuming device, possibly consuming reactive power, having a first terminal coupled to the supply terminal and a second terminal coupled to the return terminal;

a current probe, coupled to the supply terminal, for producing an incident signal;

a sampler for sampling the incident signal;

autoranging circuitry, coupled to supply terminal, for determining the frequency f of the reference signal and for setting the sampling rate sr of the sampler;

a processor, responsive to the sampler, for computing a single point DFT v of the sampled incident signal responsive to the frequency of the reference signal and for determining the phase θ and magnitude |v| of the incident signal relative to the reference signal in response to the single point DFT, including a display device for displaying an image representing the complex power consumption of the power consuming device responsive to the phase θ and magnitude |v| of the incident signal relative to the reference signal.

67. The system of claim 66 wherein the system further comprises a current probe, coupled to the supply terminal, for producing the incident signal.

68. The system of claim 66 wherein:

the source of ac power provides three phase power and includes three supply terminals producing three respective reference signals corresponding to the three phases;

the power consuming device includes three terminals respectively coupled to a corresponding supply terminals; and the system further comprising for each phase:

a current probe, coupled to the corresponding supply terminal, for generating an incident signal;

a sampler for sampling the incident signal;

autoranging circuitry, coupled to the current probe, for determining the frequency f of the reference signal and for setting the sampling rate sr of the sampler;

a processor, responsive to the sampler, for computing a single point DFT v of the sampled incident signal responsive to the frequency of the reference signal and for determining the phase θ and magnitude |v| of the incident signal relative to the reference signal in response to the single point DFT, including a display device for displaying an image representing the complex power consumption of the power consuming device responsive to the phase θ and magnitude |v| of the incident signal relative to the reference signal.

* * * * *